(12) United States Patent
Yamamoto et al.

(10) Patent No.: US 11,289,614 B2
(45) Date of Patent: Mar. 29, 2022

(54) PHOTOELECTRIC CONVERSION ELEMENT AND PHOTOELECTRIC CONVERSION MODULE

(71) Applicant: HAMAMATSU PHOTONICS K.K., Hamamatsu (JP)

(72) Inventors: Koei Yamamoto, Hamamatsu (JP); Shigeyuki Nakamura, Hamamatsu (JP); Terumasa Nagano, Hamamatsu (JP); Kenichi Sato, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 16/064,165

(22) PCT Filed: Dec. 12, 2016

(86) PCT No.: PCT/JP2016/086923
§ 371 (c)(1),
(2) Date: Jun. 20, 2018

(87) PCT Pub. No.: WO2017/110559
PCT Pub. Date: Jun. 29, 2019

(65) Prior Publication Data
US 2019/0051767 A1 Feb. 14, 2019

(30) Foreign Application Priority Data
Dec. 21, 2015 (JP) .............................. JP2015-248637

(51) Int. Cl.
*H01L 31/02* (2006.01)
*H01L 31/107* (2006.01)
(Continued)

(52) U.S. Cl.
CPC .......... *H01L 31/02027* (2013.01); *G01J 1/02* (2013.01); *G01J 1/42* (2013.01);
(Continued)

(58) Field of Classification Search
CPC ................................................ G01L 31/02027
See application file for complete search history.

(56) References Cited

U.S. PATENT DOCUMENTS 5,136,373 A * 8/1992 Kamiya ................. G01N 21/66
    348/126
6,831,692 B1 * 12/2004 Oda .................. H01L 27/14621
    348/315
(Continued)

FOREIGN PATENT DOCUMENTS

CN   104237926 A   12/2014
EP    2634821 A1    9/2013
(Continued)

OTHER PUBLICATIONS

International Preliminary Report on Patentability dated Jul. 5, 2018 for PCT/JP2016/086923.

*Primary Examiner* — Edwin C Gunberg
(74) *Attorney, Agent, or Firm* — Faegre Drinker Biddle & Reath LLP

(57) ABSTRACT

A photoelectric conversion element includes: a plurality of pixels that are formed on a common semiconductor substrate and each of which includes an avalanche photodiode; a first line that is formed on the semiconductor substrate, is electrically connected to two or more first pixels included in the plurality of pixels, and collectively extracts output currents from the two or more first pixels; and a second line that is formed on the semiconductor substrate, is electrically connected to two or more second pixels included in the plurality of pixels, and collectively extracts output currents from the two or more second pixels. A light receiving area of each first pixel is larger than a light receiving area of each second pixel.

17 Claims, 26 Drawing Sheets

(51) Int. Cl.
*G01J 1/42* (2006.01)
*H01L 27/144* (2006.01)
*G01J 1/02* (2006.01)
*H01L 31/10* (2006.01)
*H01L 27/146* (2006.01)
*G01T 1/24* (2006.01)
*H03K 23/78* (2006.01)
*H04N 5/378* (2011.01)

(52) U.S. Cl.
CPC ............ *G01T 1/247* (2013.01); *H01L 27/144* (2013.01); *H01L 27/146* (2013.01); *H01L 31/10* (2013.01); *H01L 31/107* (2013.01); *H03K 23/78* (2013.01); *H04N 5/378* (2013.01)

(56) References Cited

U.S. PATENT DOCUMENTS

| | | | |
|---|---|---|---|
| 2010/0148040 A1* | 6/2010 | Sanfilippo | H01L 31/1075 250/214.1 |
| 2010/0271108 A1 | 10/2010 | Sanfilippo et al. | |
| 2010/0316184 A1 | 12/2010 | Iwanczyk et al. | |
| 2011/0210255 A1 | 9/2011 | Kim et al. | |
| 2012/0068050 A1* | 3/2012 | Mazzillo | G01J 1/46 250/208.1 |
| 2013/0009267 A1* | 1/2013 | Henseler | G01T 1/248 257/443 |
| 2013/0068050 A1 | 3/2013 | Sakai | |
| 2014/0367576 A1* | 12/2014 | Sasaki | G01J 1/44 250/366 |

FOREIGN PATENT DOCUMENTS

| | | |
|---|---|---|
| EP | 2813866 A1 | 12/2014 |
| JP | 2000-125209 A | 4/2000 |
| JP | 4018820 B2 | 12/2007 |
| JP | 2008-287165 A | 11/2008 |
| JP | 2012-99580 A | 5/2012 |
| JP | 2013-504051 A | 2/2013 |
| WO | 2014-241543 A | 3/2011 |
| WO | WO-2011/026942 A2 | 3/2011 |

* cited by examiner (a)

(b)

PHOTOELECTRIC CONVERSION ELEMENT AND PHOTOELECTRIC CONVERSION MODULE

TECHNICAL FIELD

An aspect of the invention relates to a photoelectric conversion element and a photoelectric conversion module.

BACKGROUND ART

Patent Literature 1 discloses a radiographic image reading device. This radiographic image reading device includes a photoelectric conversion element that reads image information acquired by scanning a stimulable phosphor layer on which a radiographic image has been recorded with excitation light. The photoelectric conversion element includes a photodiode and a silicon photomultiplier tube. The photoelectric conversion element that reads image information is switched between the photodiode and the silicon photomultiplier tube depending on a light intensity of stimulable light which is read by the photoelectric conversion element.

CITATION LIST

Patent Literature

Patent Literature 1: Japanese Unexamined Patent Application Publication No. 2008-287165

SUMMARY OF INVENTION

Technical Problem

Recently, a photoelectric conversion element in which pixels each including an avalanche photodiode (hereinafter referred to as an APD) are arranged in a two-dimensional shape has been known as a photoelectric conversion element that detects weak light. In such a photoelectric conversion element, it is possible to accurately measure a weak incident light intensity on a photodiode array by supplying a common bias voltage to the pixels, collectively extracting output currents from the pixels, and performing photon counting. An example of such a photoelectric conversion element is an MPPC (registered trademark) made by Hamamatsu Photonics K.K.

However, with enlargement of an applicable range of such a photoelectric conversion element, there is demand for the capability to cope with a wide light intensity range from a weak light intensity to a relatively high light intensity. An aspect of the invention is made in consideration of the above-mentioned circumstances and an objective thereof is to provide a photoelectric conversion element and a photoelectric conversion module that can cope with a wide light intensity range.

Solution to Problem

In order to achieve the above-mentioned objective, a photoelectric conversion element according to an aspect of the invention includes: a plurality of pixels that are formed on a common semiconductor substrate and each of which includes an avalanche photodiode; a first line that is formed on the semiconductor substrate, is electrically connected to two or more first pixels included in the plurality of pixels, and collectively extracts output currents from the two or more first pixels; and a second line that is formed on the semiconductor substrate, is electrically connected to two or more second pixels included in the plurality of pixels, and collectively extracts output currents from the two or more second pixels, and a light receiving area of each first pixel is larger than a light receiving area of each second pixel.

In this photoelectric conversion element, two types of pixels having different light receiving areas are included in the plurality of pixels. That is, in two or more first pixels having a relatively large light receiving area, even when an incident light intensity is weak, the incident light intensity can be converted into an output current with high photon detection efficiency (PDE). In other words, since a current can be output with a large gain for an incident light intensity, it is possible to decrease a lower limit of a detectable incident light intensity. On the other hand, in two or more second pixels having a relatively small light receiving area, even when an incident light intensity is relatively large, the incident light intensity can be converted into an output current with low PDE. In other words, since a current can be output with a small gain for an incident light intensity, it is possible to increase an upper limit of an incident light intensity at which the output is saturated. Accordingly, with the photoelectric conversion element, it is possible to cope with a wide light intensity range from a weak light intensity to a relatively large light intensity by selectively extracting output currents from the first line or the second line depending on the incident light intensity.

In the photoelectric conversion element, the two or more second pixels may be disposed in a first area, and the two or more first pixels may be disposed in a second area which surrounds the first area. In general, when an optical axis of incident light is adjusted to the center of a light receiving surface of the photoelectric conversion element, a light intensity is the largest in the vicinity of the center of the light receiving surface. By disposing the first and second pixels as described above, it is possible to dispose the second pixels in an area in which the light intensity is relatively large and to dispose the first pixels in an area in which the light intensity is relatively small. Accordingly, it is possible to more accurately detect an incident light intensity.

In the photoelectric conversion element, a plurality of third areas including $K_1$ (where $K_1$ is an integer equal to or greater than 2) second pixels and a plurality of fourth areas including L (where L is an integer equal to or greater than 1 and $L<K_1$ is satisfied) first pixels may be mixed and arranged in a two-dimensional shape. Alternatively, a plurality of areas including one first pixel and $K_2$ (where $K_2$ is an integer equal to or greater than 1) second pixels may be arranged in a two-dimensional shape. With this arrangement, it is possible to satisfactorily achieve the same effects as those in the photoelectric conversion element according to the aspect of the invention.

In the photoelectric conversion element, a resistance value of a quenching resistor of each second pixel may be greater than a resistance value of a quenching resistor of each first pixel. Accordingly, since a magnitude of a current output from the second pixels is minimized, it is possible to further increase the upper limit of the incident light intensity at which the output is saturated.

In the photoelectric conversion element, a bias voltage which is applied to the second pixels may be less than a bias voltage which is applied to the first pixels. Accordingly, it is possible to further widen a manageable light intensity range.

In order to achieve the above-mentioned objective, a photoelectric conversion element according to an aspect of the invention includes: a plurality of pixels that are formed on a common semiconductor substrate and each of which includes an avalanche photodiode; a first line that is formed on the semiconductor substrate, is electrically connected to two or more first pixels included in the plurality of pixels via a quenching resistor, and collectively extracts output currents from the two or more first pixels; and a second line that is formed on the semiconductor substrate, is electrically connected to two or more second pixels included in the plurality of pixels via a quenching resistor, and collectively extracts output currents from the two or more second pixels, and a resistance value of the quenching resistor of each second pixel is greater than a resistance value of the quenching resistor of each first pixel.

In this photoelectric conversion element, the resistance value of the quenching resistor of each second pixel is greater than the resistance value of the quenching resistor of each first pixel. In the two or more first pixels in which the resistance value of the quenching resistor is relatively small, a relatively large current can be output even when the incident light intensity is weak. In other words, since a current can be output with a large gain for the incident light intensity, it is possible to decrease the lower limit of the detectable incident light intensity. On the other hand, in the two or more second pixels in which the resistance value of the quenching resistor is relatively large, a relatively small current can be output even when the incident light intensity is relatively large. In other words, since a current can be output with a small gain for the incident light intensity, it is possible to further increase the upper limit of the incident light intensity at which the output is saturated. Accordingly, with the photoelectric conversion element, it is possible to cope with a wide light intensity range from a weak light intensity to a relatively large light intensity by selectively extracting the output current from the first line or the second line depending on the incident light intensity.

In the photoelectric conversion element, a light receiving area of each first pixel and a light receiving area of each second pixel may be substantially equal to each other. Accordingly, by only changing the resistance values of the quenching resistors in a conventional photoelectric conversion element, it is possible to easily achieve the above-mentioned effects.

In the photoelectric conversion element, the quenching resistor of each second pixel may be longer than the quenching resistor of each first pixel. Alternatively, a width in a direction intersecting an extending direction of the quenching resistor of each second pixel may be smaller than a width in a direction intersecting an extending direction of the quenching resistor of each first pixel. For example, by employing at least one configuration among these configurations, the resistance value of the quenching resistor of each second pixel can be easily set to be greater than the resistance value of the quenching resistor of each first pixel.

In the photoelectric conversion element, a bias voltage which is applied to the second pixels may be less than a bias voltage which is applied to the first pixels. Accordingly, it is possible to further widen a manageable light intensity range.

In order to achieve the above-mentioned objective, a photoelectric conversion element according to an aspect of the invention includes: a plurality of pixels that are formed on a common semiconductor substrate and each of which includes an avalanche photodiode that operates with a common bias voltage; a first line that is formed on the semiconductor substrate, is electrically connected to two or more first pixels included in the plurality of pixels, and collectively extracts output currents from the two or more first pixels; a second line that is formed on the semiconductor substrate, is electrically connected to two or more second pixels included in the plurality of pixels, and collectively extracts output currents from the two or more second pixels; a first resistor that is connected between the first line and a fixed potential line and converts the output currents from the two or more first pixels into a first voltage signal; and a second resistor that is connected between the second line and a fixed potential line and converts the output currents from the two or more second pixels into a second voltage signal, and a resistance value of the second resistor is less than a resistance value of the first resistor.

A photoelectric conversion module according to an aspect of the invention is a photoelectric conversion module including: a photoelectric conversion element; and a reader circuit that reads an output current from the photoelectric conversion element, wherein the photoelectric conversion element includes a plurality of pixels that are formed on a common semiconductor substrate and each of which includes an avalanche photodiode that operates with a common bias voltage, a first line that is formed on the semiconductor substrate, is electrically connected to two or more first pixels included in the plurality of pixels, and collectively extracts output currents from the two or more first pixels, and a second line that is formed on the semiconductor substrate, is electrically connected to two or more second pixels included in the plurality of pixels, and collectively extracts output currents from the two or more second pixels, the reader circuit or the photoelectric conversion element includes a first resistor that is connected between the first line and a fixed potential line and converts the output currents from the two or more first pixels into a first voltage signal, and a second resistor that is connected between the second line and a fixed potential line and converts the output currents from the two or more second pixels into a second voltage signal, and a resistance value of the first resistor is greater than a resistance value of the second resistor.

In the photoelectric conversion element and the photoelectric conversion module, the resistance value of the first resistor that converts the output current from the first pixels into a voltage signal is greater than the resistance value of the second resistor that converts the output current from the second pixels into a voltage signal. Accordingly, even when an incident light intensity is weak, the output currents from the two or more first pixels can be converted into a voltage signal with a relatively large amplification factor. In other words, since a voltage signal can be output with a large gain for the incident light intensity, it is possible to accurately perform photon counting. On the other hand, even when an incident light intensity is relatively large, the output currents from the two or more second pixels can be converted into a voltage signal with a relatively small amplification factor. In other words, since a voltage signal can be output with a small gain for the incident light intensity, it is possible to further increase the upper limit of the incident light intensity at which the output is saturated. Accordingly, with the photoelectric conversion element and the photoelectric conversion module, it is possible to cope with a wide light intensity range from a weak light intensity to a relatively large light intensity by selecting the first voltage signal or the second voltage signal depending on the incident light intensity.

In the photoelectric conversion module, the same configuration as the conventional photoelectric conversion element except that two types of lines (first and second lines) for collectively extracting the output currents from the pixels are provided can be employed. Accordingly, it is possible to very easily design a photoelectric conversion element and to curb a variation in characteristics from the conventional photoelectric conversion element.

In the photoelectric conversion module, the reader circuit may include: a photon counting circuit that counts current pulses output from the two or more first pixels on the basis of the first voltage signal; and an A/D converter that generates a digital signal corresponding to the second voltage signal. Accordingly, it is possible to suitably read a signal corresponding to a wide light intensity range from a weak light intensity to a relatively large light intensity.

Advantageous Effects of Invention

According to an aspect of the invention, it is possible to provide a photoelectric conversion element and a photoelectric conversion module that can cope with a wide light intensity range.

BRIEF DESCRIPTION OF DRAWINGS

FIG. 7(*b*) is an enlarged plan view of a fourth area.

DESCRIPTION OF EMBODIMENTS

First Embodiment

Hereinafter, an embodiment of a photoelectric conversion element according to an aspect of the invention will be described in detail with reference to the accompanying drawings. In description with reference to the drawings, the same elements will be referred to by the same reference signs and description thereof will not be repeated.

Figure 1:
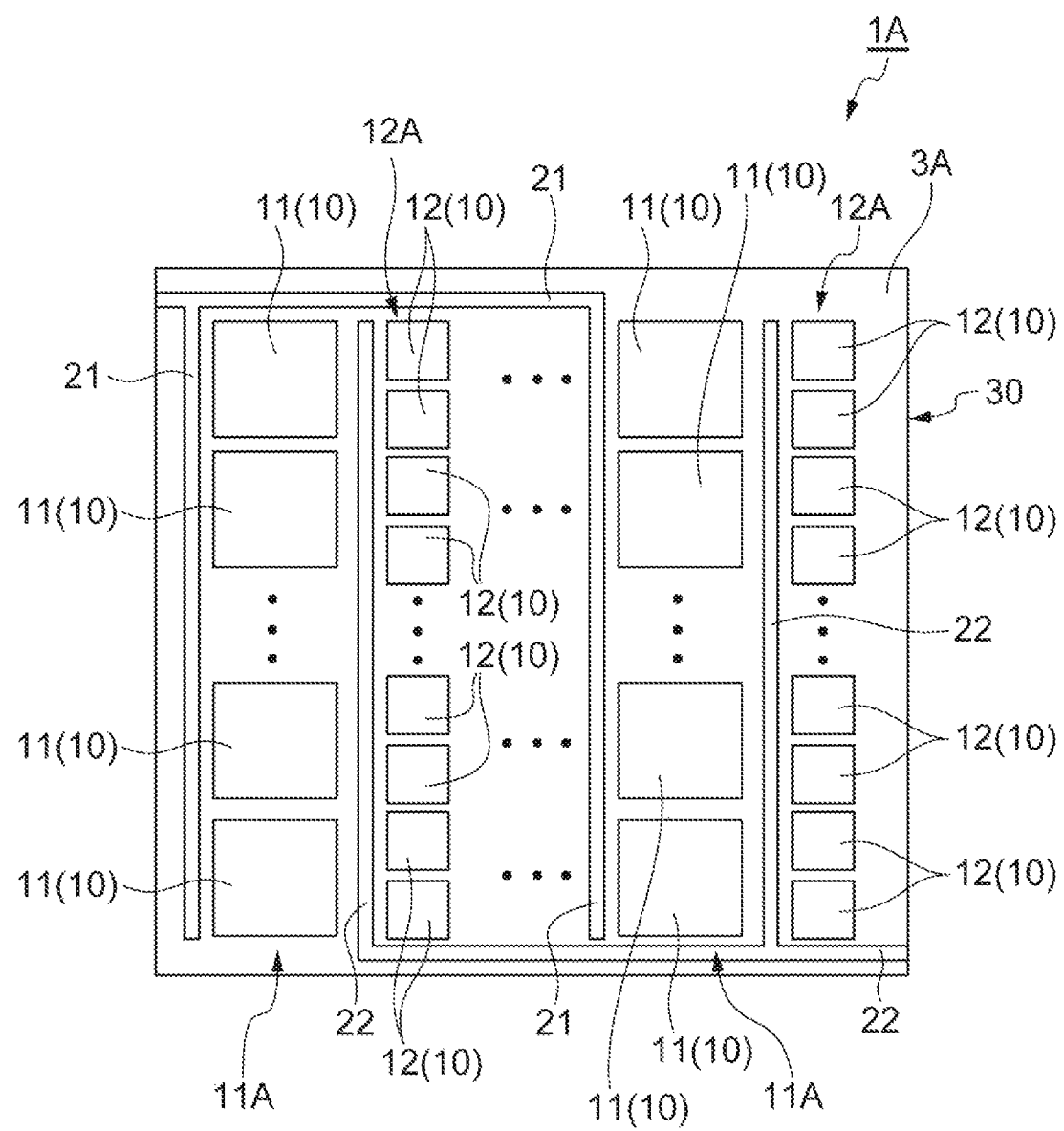
FIG. 1 is a plan view of a photoelectric conversion element according to an embodiment of an aspect of the invention.

FIG. 1 is a plan view of a photoelectric conversion element 1A according to an embodiment of an aspect of the invention. The photoelectric conversion element 1A includes a semiconductor substrate 30, and a principal surface of the semiconductor substrate 30 serves as a light receiving portion 3A that receives light. In the light receiving portion 3A, a plurality of pixels 10 are arranged in a two-dimensional shape. Each of the plurality of pixels 10 includes an APD that operates with a common bias voltage.

The plurality of pixels 10 include two or more first pixels 11 and two or more second pixels 12. A light receiving area (an effective sensitive area) of each first pixel 11 is greater than the light receiving area of each second pixel 12. For example, a pitch (an inter-center gap) between neighboring first pixels 11 is 50 μm, and a pitch (an inter-center gap) between neighboring second pixels 12 is 10 μm. An aperture ratio of each pixel increases as the light receiving area increases. In this embodiment, first pixel arrays 11A in which the first pixels 11 are arranged in a column direction and second pixel arrays 12A in which the second pixels 12 are arranged in the column direction are alternately arranged in a row direction. The number of pixels per column of the first pixel arrays 11A is less than the number of pixels per column of the second pixel arrays 12A.

The photoelectric conversion element 1A further includes a first line 21 and a second line 22 for reading a signal. The first line 21 is electrically connected to the two or more first pixels 11 and collectively extracts output currents from these first pixels 11. The second line 22 is electrically connected to the two or more second pixels 12 and collectively extracts output currents from these second pixels 12.

Figure 2:
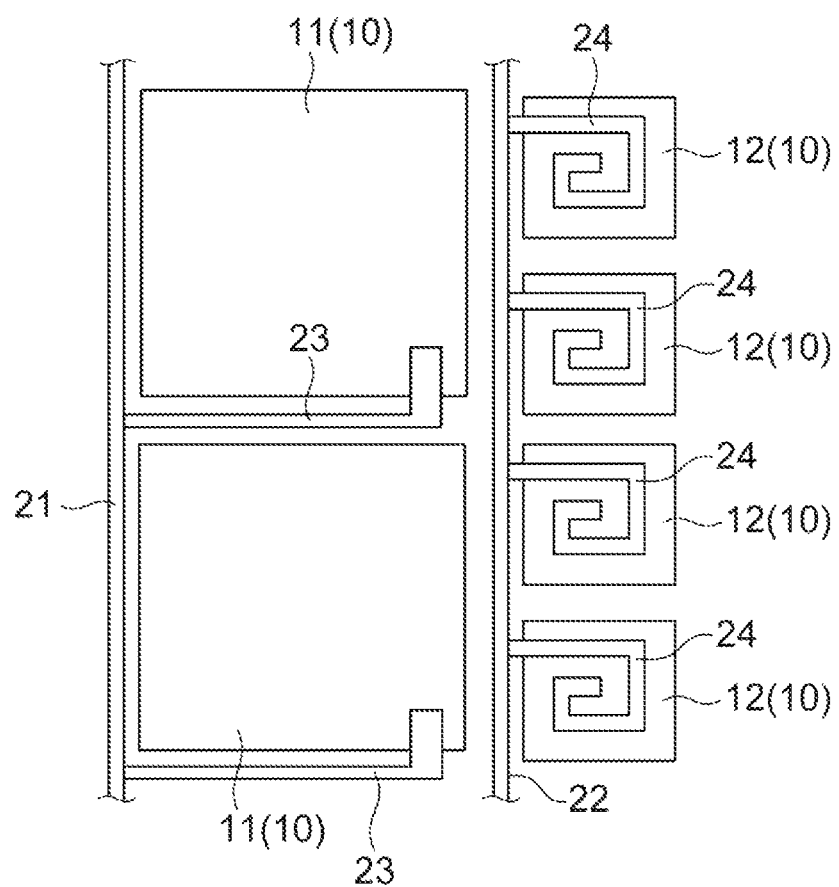
FIG. 2 is an enlarged plan view illustrating a part of a light receiving surface.

FIG. 2 is an enlarged plan view illustrating a part of the light receiving portion 3A. As illustrated in FIG. 2, the APD of each first pixel 11 and the first line 21 are electrically connected to each other via a quenching resistor 23. In other words, one end of the quenching resistor 23 is electrically connected to the APD of the corresponding first pixel 11, and the other end thereof is electrically connected to the first line 21. Similarly, the APD of each second pixel 12 and the second line 22 are electrically connected to each other via a quenching resistor 24. In other words, one end of the quenching resistor 24 is electrically connected to the APD of the corresponding second pixel 12, and the other end thereof is electrically connected to the second line 22.

The resistance value of the quenching resistor 24 of each second pixel 12 may be set to be larger than the resistance value of the quenching resistor 23 of each first pixel 11. For example, the resistance value of the quenching resistor 24 is 1 MΩ and the resistance value of the quenching resistor 23 is 250 kΩ. This difference in resistance values between the quenching resistors is realized, for example, by setting cross-sectional areas of the quenching resistors to be different from each other or setting lengths of the quenching resistors to be different from each other. In the example illustrated in FIG. 2, the quenching resistor 23 is disposed in a straight line shape in order to decrease the resistance value of the quenching resistor 23, and the quenching resistor 24 is disposed in a spiral shape to increase the resistance value of the quenching resistor 24. The quenching resistors 23 and 24 are formed of, for example, a light-transmitting (translucent) conductive material.

Figure 3:
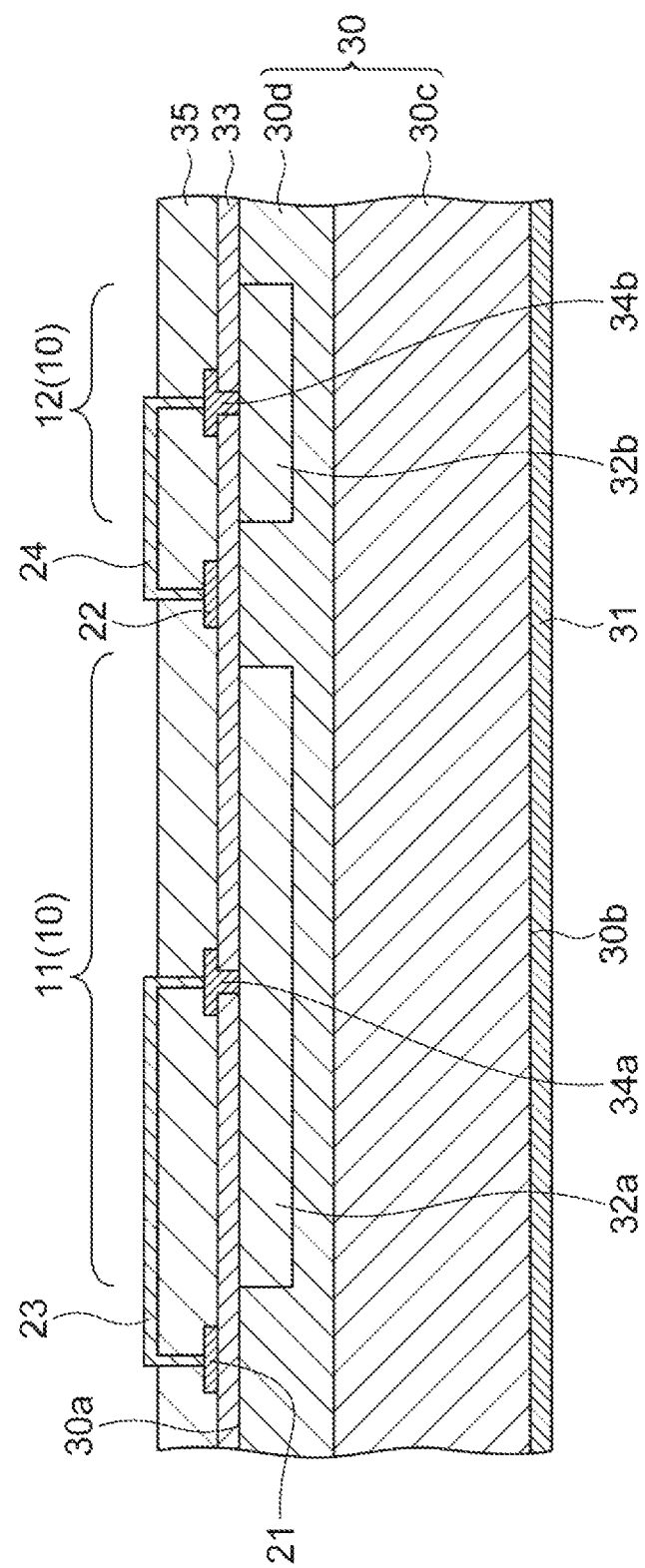
FIG. 3 is a diagram schematically illustrating a sectional configuration of the photoelectric conversion element.

FIG. 3 is a diagram schematically illustrating a sectional configuration of the photoelectric conversion element 1A. The photoelectric conversion element 1A includes a semiconductor substrate 30. The plurality of pixels 10 are formed on the common semiconductor substrate 30. Specifically, the semiconductor substrate 30 includes a principal surface 30a and a rear surface 30b, and a bottom electrode (a cathode) 31 is formed on the entire surface of the rear surface 30b. In the semiconductor substrate 30, a region 30e including the rear surface 30b and formed of n-type Si and a region 30d including the principal surface 30a and formed of p-type Si are stacked. In the region 30d including the principal surface 30a, a p-type semiconductor region 32a constituting a first pixel 11 and a p-type semiconductor region 32b constituting a second pixel 12 are arranged with a gap therebetween. The p-type semiconductor regions 32a and 32b are formed of, for example, p-type Si. The APD of the first pixel 11 is constituted by causing the region 30d and the region 30c just below the p-type semiconductor region 32a to form a pn junction. Similarly, the APD of the second pixel 12 is constituted by causing the region 30d and the region 30c just below the p-type semiconductor region 32b to form a pn junction.

The light receiving area of the first pixel 11 is defined by the area of the p-type semiconductor region 32a seen in the thickness direction of the semiconductor substrate 30. Similarly, the light receiving area of the second pixel 12 is defined by the area of the p-type semiconductor region 32b seen in the same direction. That is, the area of the p-type semiconductor region 32a is larger than the area of the p-type semiconductor region 32b.

A first insulating film 33 is formed on the entire surface of the principal surface 30a. The first insulating film 33 can be formed of, for example, an insulating silicon compound such as SiO$_2$ or SiN. A contact electrode (an anode) 34a is formed on the p-type semiconductor region 32a and on the first insulating film 33. The contact electrode 34a is in contact with the p-type semiconductor region 32a via an opening formed in the first insulating film 33. Similarly, a contact electrode (an anode) 34b is formed on the p-type semiconductor region 32b and on the first insulating film 33. The contact electrode 34b is in contact with the p-type semiconductor region 32b via an opening formed in the first insulating film 33.

The first line 21 and the second line 22 are formed of a metal and are formed on the semiconductor substrate 30. In this embodiment, the first line 21 and the second line 22 are formed on the first insulating film 33 which is located on the area of the semiconductor substrate 30 in which none of the p-type semiconductor region 32a and the p-type semiconductor region 32b is formed.

The first line 21, the second line 22, the first insulating film 33, and the contact electrodes 34a and 34b are covered by a second insulating film 35. The second insulating film 35 covers the entire surface of the semiconductor substrate 30 and can be formed of, for example, an insulating silicon compound such as SiO$_2$ or SiN. The quenching resistors 23 and 24 are formed on the second insulating film 35. One end and the other end of the quenching resistor 23 are electrically connected to the contact electrode 34a and the first line 21, respectively, via openings formed in the second insulating film 35. One end and the other end of the quenching resistor 24 are electrically connected to the contact electrode 34b and the second line 22, respectively, via openings formed in the second insulating film 35.

Figure 4:
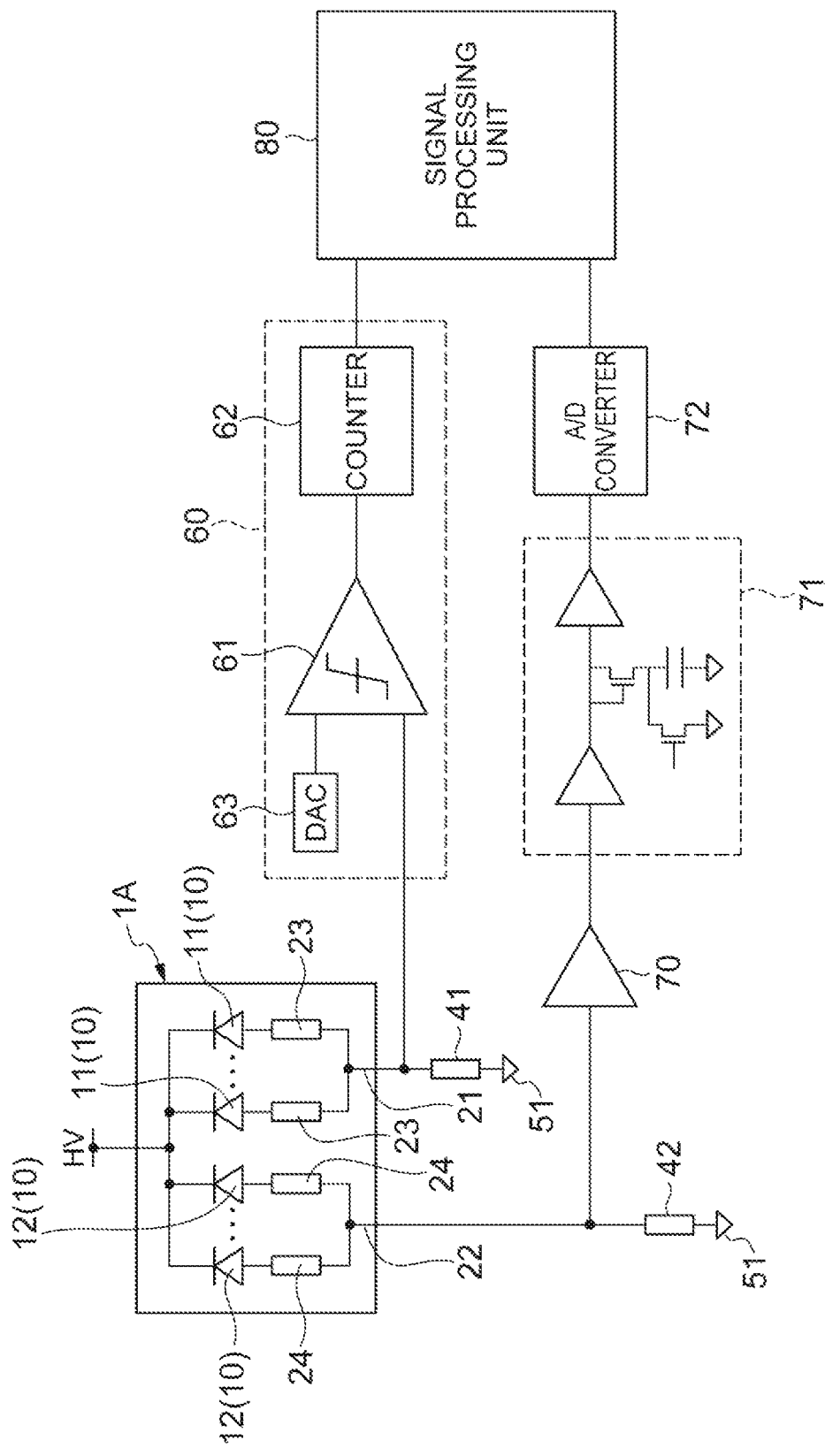
FIG. 4 is a diagram schematically illustrating an example of a configuration of an external circuit.

An example of a configuration of an external circuit that reads a signal from the photoelectric conversion element 1A according to this embodiment will be described now. FIG. 4 is a diagram schematically illustrating an example of a configuration of an external circuit. As illustrated in FIG. 4, a common bias voltage HV is applied to the cathodes of the APDs of the plurality of pixels 10, that is, the bottom electrode 31 (see FIG. 3).

The anode of the APD of the first pixel 11 is connected to one end of a resistor 41 formed outside the photoelectric conversion element 1A via the quenching resistor 23 and the first line 21. The other end of the resistor 41 is connected to a reference potential (GND) line 51. One end of the resistor 41 is connected to a photon counting circuit 60, and a dropped voltage in the resistor 41 is input to the photon counting circuit 60.

The photon counting circuit 60 includes a comparator 61 and a counter 62. The comparator 61 compares a reference voltage generated by a D/A converter 63 with the dropped voltage in the resistor 41. When the dropped voltage in the resistor 41 is higher than the reference voltage (that is, when a current pulse greater than a threshold value is output from the first pixel 11), a signal is sent to the counter 62. The counter 62 counts the number of times the signal has been sent from the comparator 61. The count value corresponds to an incident light intensity on all the first pixels 11.

The anode of the APD of the second pixel 12 is connected to one end of a resistor 42 disposed outside the photoelectric conversion element 1A via the quenching resistor 24 and the second line 22. The other end of the resistor 42 is connected to the reference potential (GND) line 51. One end of the resistor 42 is connected to an A/D converter 72 via an amplifier circuit 70 and a peak hold circuit 71. A dropped voltage in the resistor 42 is amplified by the amplifier circuit 70 and is then held by the peak hold circuit 71. Then, the held voltage is input to the A/D converter 72. The A/D converter 72 converts an input voltage signal (an analog signal) into a digital signal. The digital value corresponds to an incident light intensity on all the second pixels 12.

The count value output from the counter 62 and the digital value output from the A/D converter 72 are sent to a signal processing unit 80. The signal processing unit 80 selects one having a significant value of the count value and the digital value and specifies an incident light intensity on the basis of the selected value.

Advantageous effects obtained by the above-mentioned photoelectric conversion element 1A according to this embodiment will be described below. In a conventional photoelectric conversion element (an APD array) in which a plurality of pixels having the same area and including an APD are arranged, the light receiving area and the dynamic range of each pixel have a trade-off relationship. That is, in a photoelectric conversion element having a large light receiving area of each pixel (a pitch between pixels is large), an aperture ratio can be designed to be large and it is thus possible to accurately detect few photons even when the incident light intensity is very small. On the other hand, in a photoelectric conversion element having a small light receiving area of each pixel (a pith between pixels is small), the number of pixels per unit area is large and the number of pixels in a standby state is large and it is thus possible to provide excellent followability (linearity) even when the number of photons which are simultaneously incident is large. Since a capacitance value of each pixel decreases, a filtering operation which is caused by a capacitor of each pixel and the quenching resistor is weakened and a temporal waveform of an output current becomes sharper. Accordingly, since the time from detection of photons to return to the standby state is short, it is advantageous over a temporal dynamic range thereof.

In the photoelectric conversion element 1A according to this embodiment, two types of pixels 11 and 12 having different light receiving areas are included in a plurality of pixels 10. That is, in two or more first pixels 11 having a relatively large light receiving area, the aperture ratio is large and thus even when the incident light intensity is weak, the incident light intensity can be converted into an output current with high photon detection efficiency (PDE). In other words, since a current can be output with a large gain for the incident light intensity, it is possible to decrease a lower limit of a detectable incident light intensity. On the other hand, in two or more second pixels 12 having a relatively small light receiving area, even when an incident light intensity is relatively large, the incident light intensity can be converted into an output current with low PDE. In other words, since a current can be output with a small gain for the incident light intensity, it is possible to increase an upper limit of the incident light intensity at which the output is saturated. Accordingly, with the photoelectric conversion element 1A according to this embodiment, it is possible to cope with a wide light intensity range from a weak light intensity to a relatively large light intensity by selectively extracting the output current from the first line 21 or the second line 22 depending on the incident light intensity.

According to this embodiment, it is possible to cope a case in which an incident light intensity is weak and a case in which an incident light intensity is relatively large using one device with a common principle of light detection in the pixels. Accordingly, it is possible to expect use of a common operation voltage, a decrease in cost due to construction on the same substrate, and uniformity in characteristics. According to this embodiment, it is possible to arrange a plurality of pixels 10 in a two-dimensional shape and to easily realize a light receiving surface with a large area. It is possible to increase a degree of freedom in arrangement of a plurality of pixels 10 and to easily change the light receiving portion 3A to a shape suitable for an application or optical system, such as a square, a rectangle, a circle, and a polygon.

As in this embodiment, the resistance value of the quenching resistor 24 of the second pixel 12 may be set to be greater than the resistance value of the quenching resistor 23 of the first pixel 11. Accordingly, since the magnitude of a current output from the second pixel 12 is curbed, it is possible to further increase the upper limit of the incident light intensity at which the output is saturated.

First Modified Example

Figure 5:
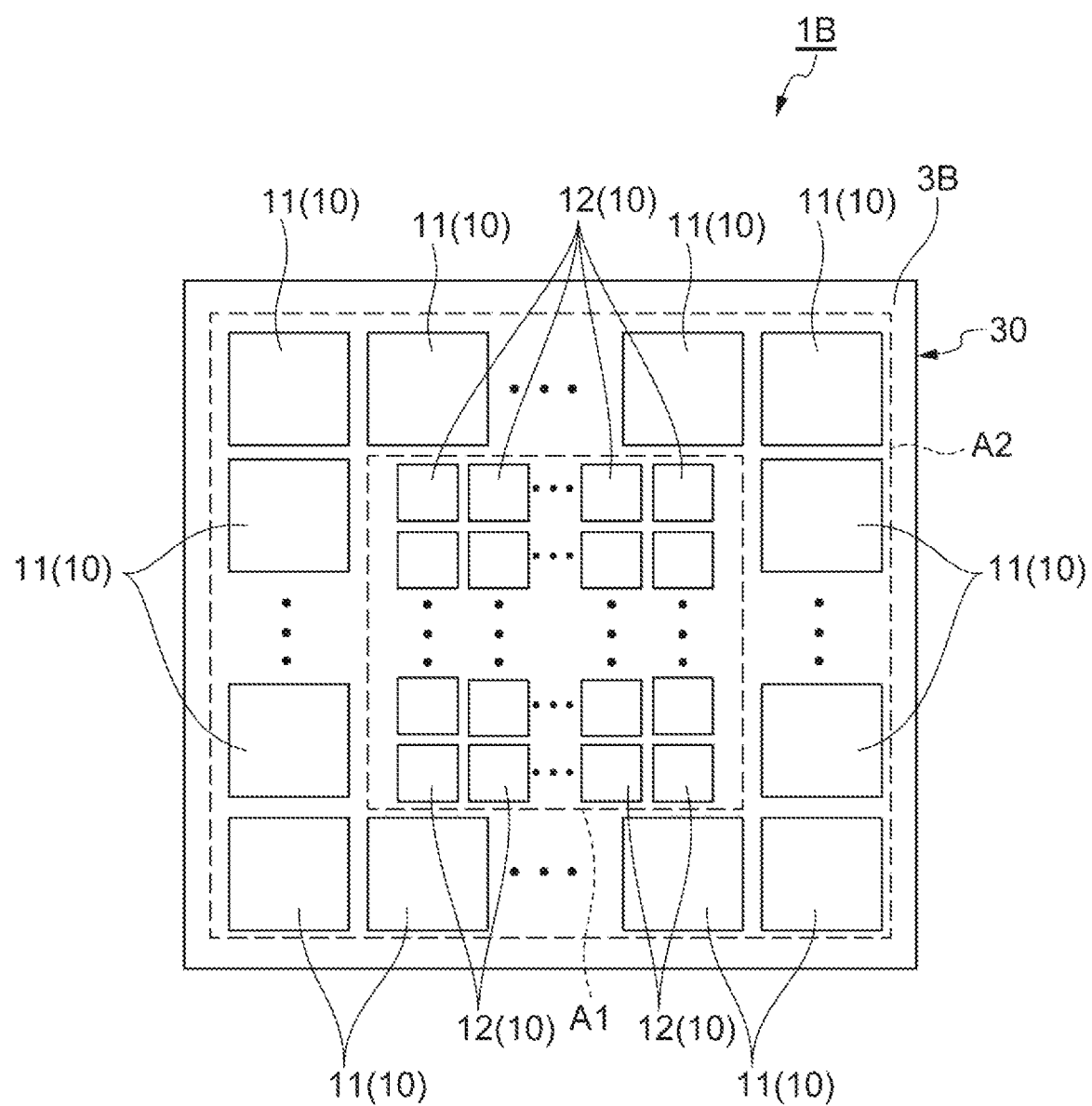
FIG. 5 is a plan view of a photoelectric conversion element according to a modified example.

FIG. 5 is a plan view of a photoelectric conversion element 1B according to a modified example. The first and second lines 21 and 22 are not illustrated in the drawing. The photoelectric conversion element 1B is different from that of the above-mentioned embodiment in the arrangement of the first pixels 11 and the second pixels 12 on the light receiving surface. In a light receiving portion 3A according to this modified example, two or more second pixels 12 are arranged in a first area A1 on the semiconductor substrate 30. The first area A1 is a rectangular or oblong area including the center of the light receiving portion 3A. Two or more first pixels 11 are arranged in a second area A2 surrounding the first area A1.

In general, when an optical axis of incident light is adjusted to the center of the light receiving surface of the photoelectric conversion element, the light intensity is the largest in the vicinity of the center of the light receiving surface. By arranging the first and second pixels 11 and 12 as in this modified example, the second pixels 12 can be arranged in an area in which the light intensity is relatively large, and the first pixels 11 can be arranged in an area in which the light intensity is relatively small. Accordingly, it is possible to more accurately detect an incident light intensity.

Second Modified Example

Figure 6:
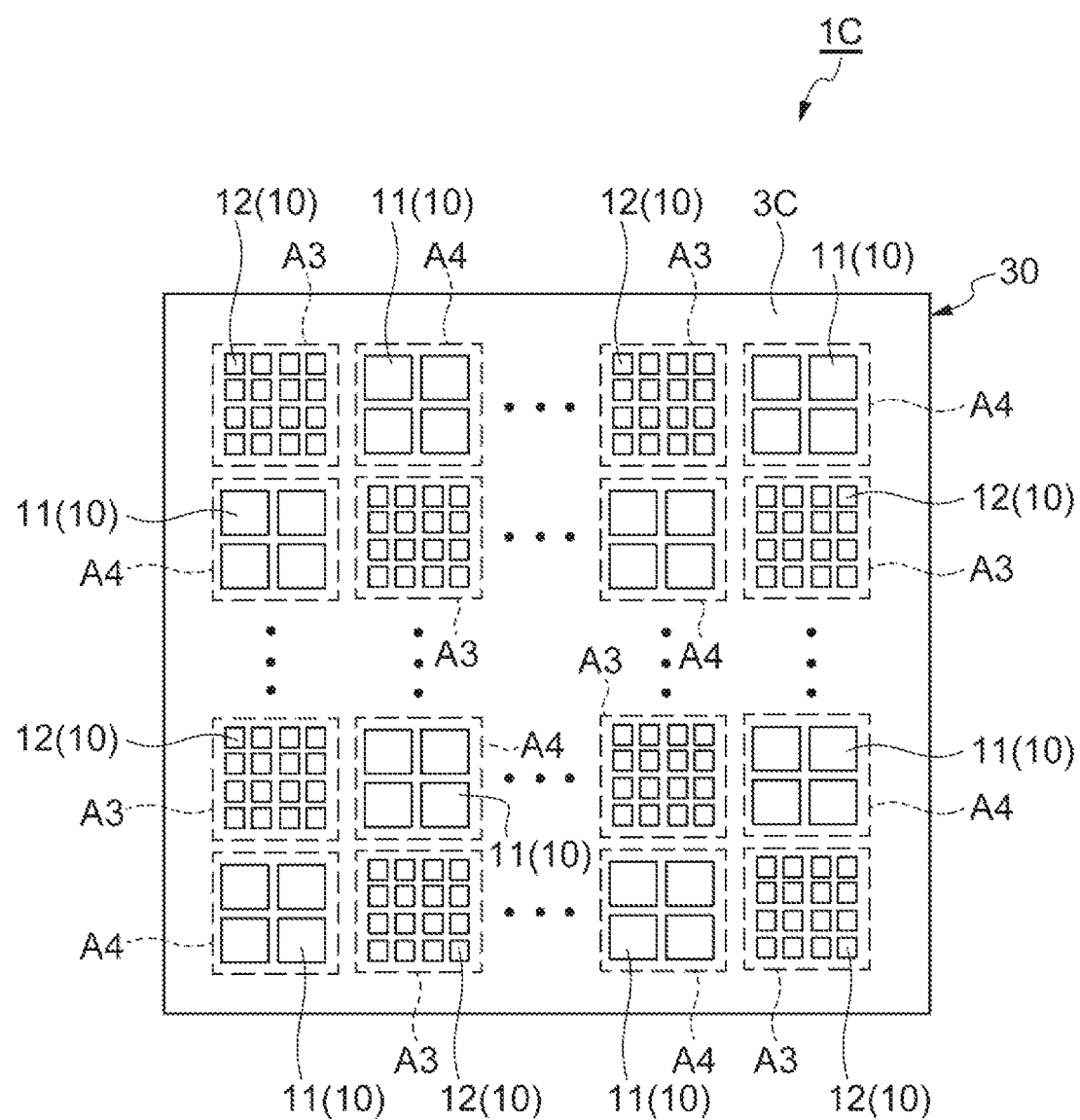
FIG. 6 is a plan view of a photoelectric conversion element according to another modified example.

FIG. 6 is a plan view of a photoelectric conversion element 1C according to another modified example. The first and second lines 21 and 22 are not illustrated in the drawing. The photoelectric conversion element 1C is different from that of the above-mentioned embodiment in the arrangement of the first pixels 11 and the second pixels 12 on the light receiving surface. In a light receiving portion 3C, a plurality of third areas A3 including $K_1$ (where $K_1$ is an integer equal to or greater than 2; a case of $K_1=16$ is illustrated in the drawing) second pixels 12 and a plurality of fourth areas A4 including L (where L is an integer equal to or greater than 1 and satisfies $L<K_1$; a case of $L=4$ is illustrated in the drawing) first pixels 11 are mixed and arranged in a two-dimensional shape (a matrix shape) in the light receiving portion 3C.

Figure 7:
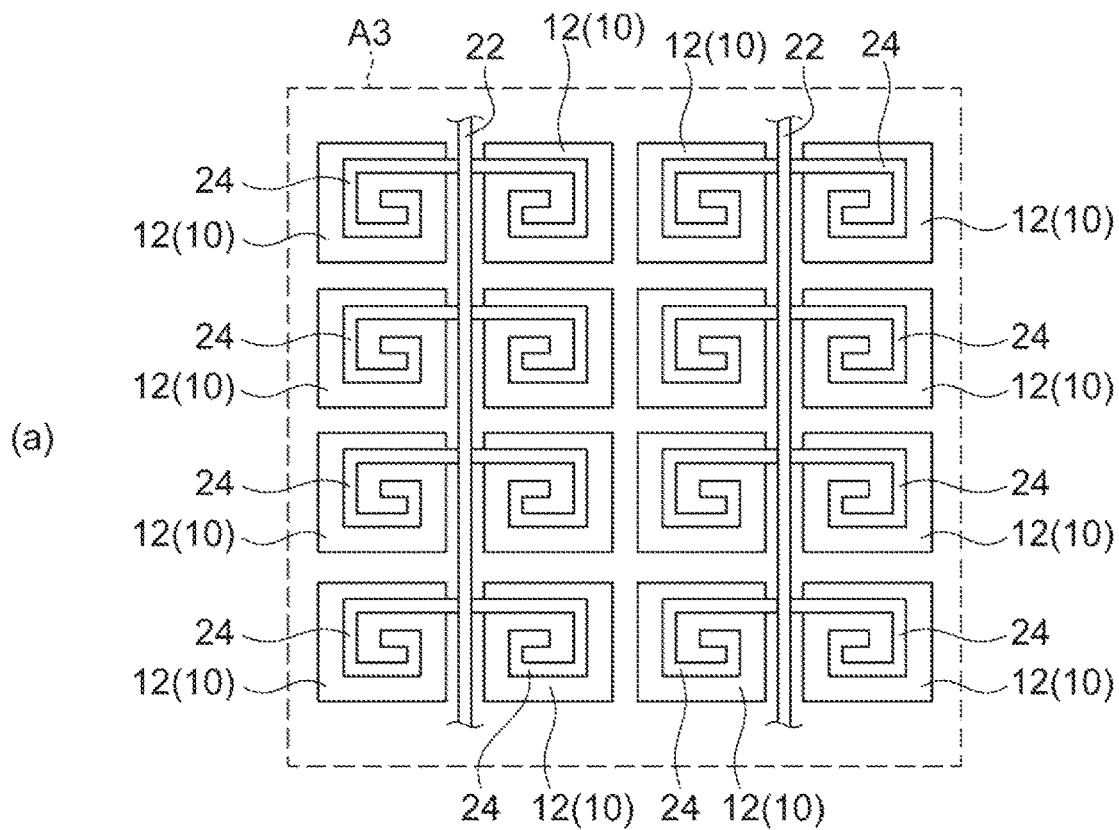
FIG. 7(*a*) is an enlarged plan view of a third area.
Figure 7:
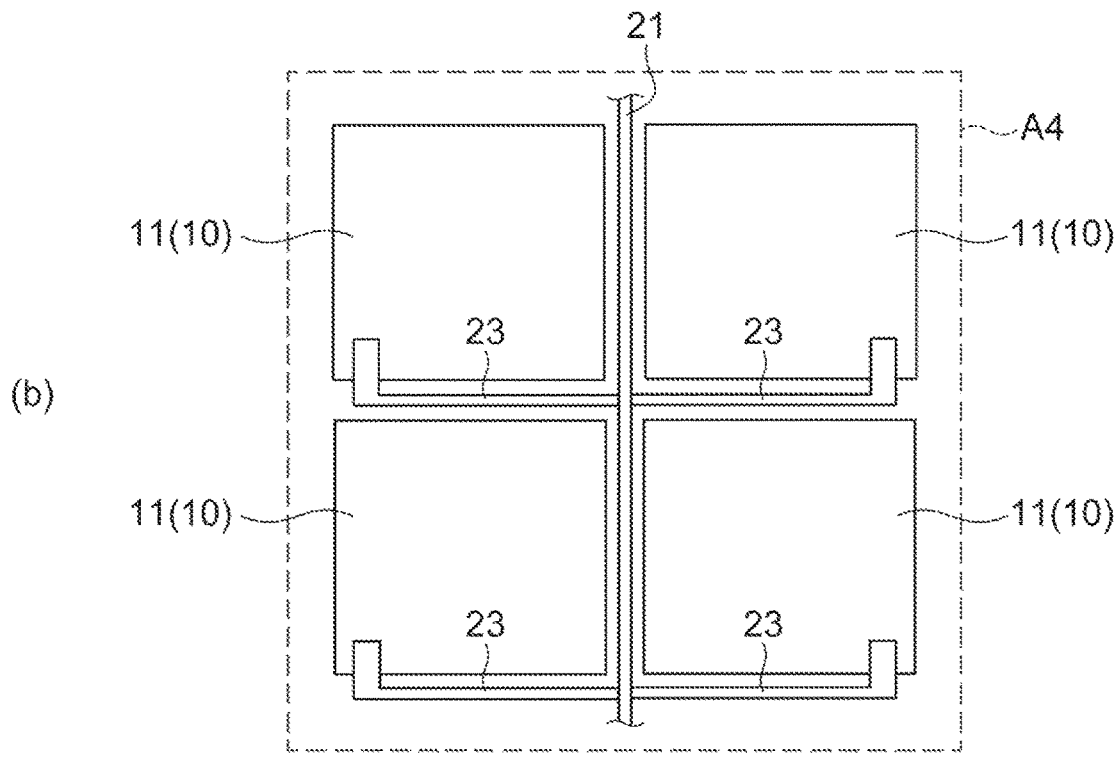

FIGS. 7(a) and 7(b) are enlarged plan views illustrating the third area A3 and the fourth area A4. In the example, the second pixels 12 are arranged in a two-dimensional shape of $M_1$ rows and $N_1$ columns (where $M_1$ and $N_1$ are integers equal to or greater than 1; $M_1 \times N_1 = K_1$) in the third area A3. The second lines 22 are arranged every two columns, and the second pixels 12 located on both sides of each second line 22 are electrically connected to the second line 22 via the quenching resistors 24. Similarly, the first pixels 11 are arranged in a two-dimensional shape of $M_2$ rows and $N_2$ columns (where $M_2$ and $N_2$ are integers equal to or greater than 1; $M_2 \times N_2 = L$) in the fourth area A4. The first lines 21 are arranged every two columns, and the first pixels 11 located on both sides of each first line 21 are electrically connected to the first line 21 via the quenching resistors 23.

Figure 8:
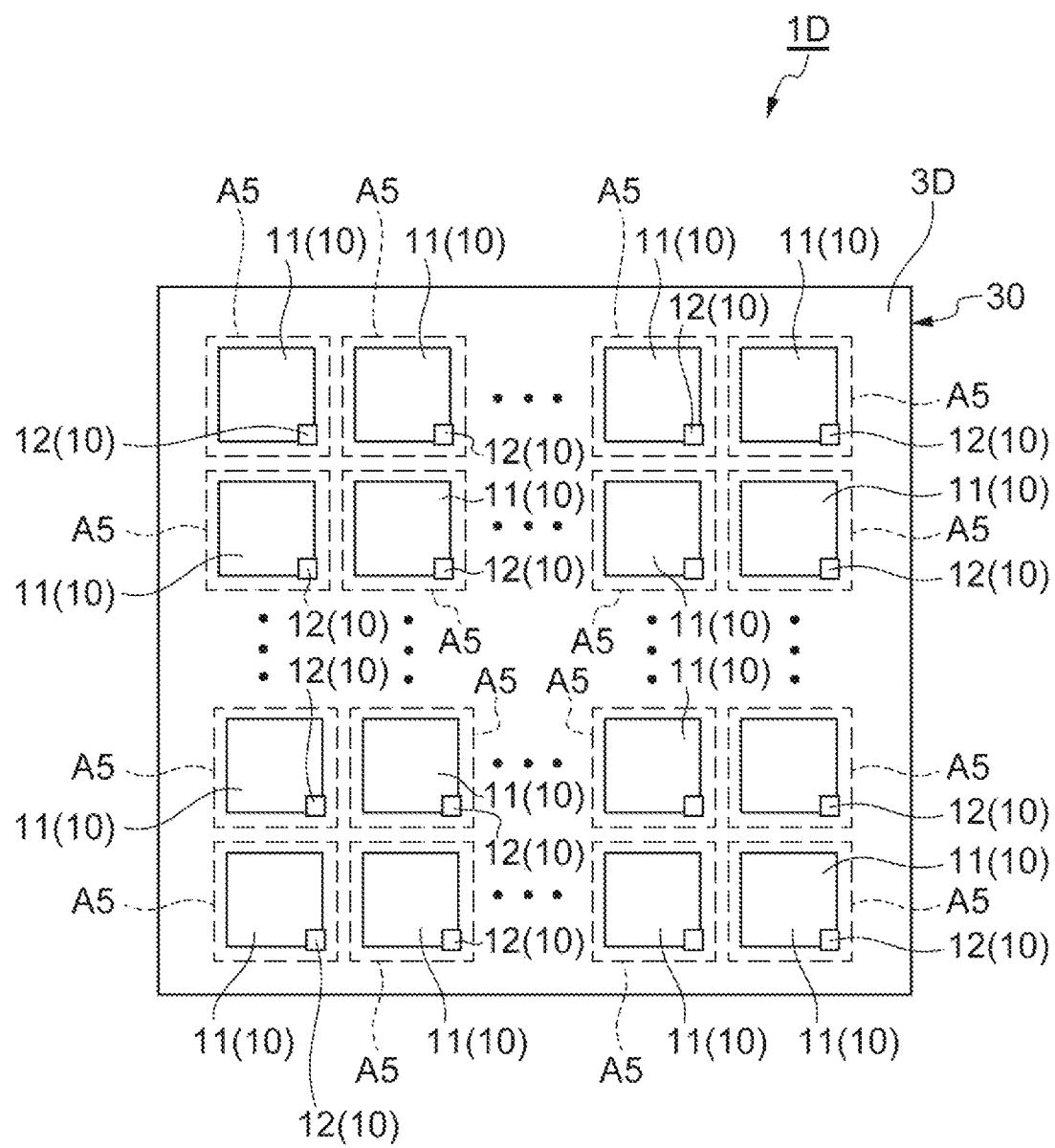
FIG. 8 is a plan view of a photoelectric conversion element according to another modified example.

FIG. 8 is a plan view of a photoelectric conversion element 1D according to another modified example. The photoelectric conversion element 1D is different from that of the above-mentioned embodiment in the arrangement of the first pixels 11 and the second pixels 12 on the light receiving surface. In a light receiving portion 3D according to this modified example, a plurality of areas each including one first pixel 11 and $K_2$ (where $K_2$ is an integer equal to or greater than 1; a case of $K_2=1$ is illustrated in the drawing) second pixels 12 are arranged in a two-dimensional shape (a matrix shape).

The arrangement of the first and second pixels in an aspect of the invention is not limited to the above-mentioned embodiment, and, for example, various arrangements of the photoelectric conversion element 1B according to the first modified example and the photoelectric conversion element 1C or 1D according to this modified example can be employed. With any arrangement of pixels, it is possible to appropriately achieve the same advantageous effects as in the photoelectric conversion element 1A according to the above-mentioned embodiment.

Third Modified Example

Figure 9:
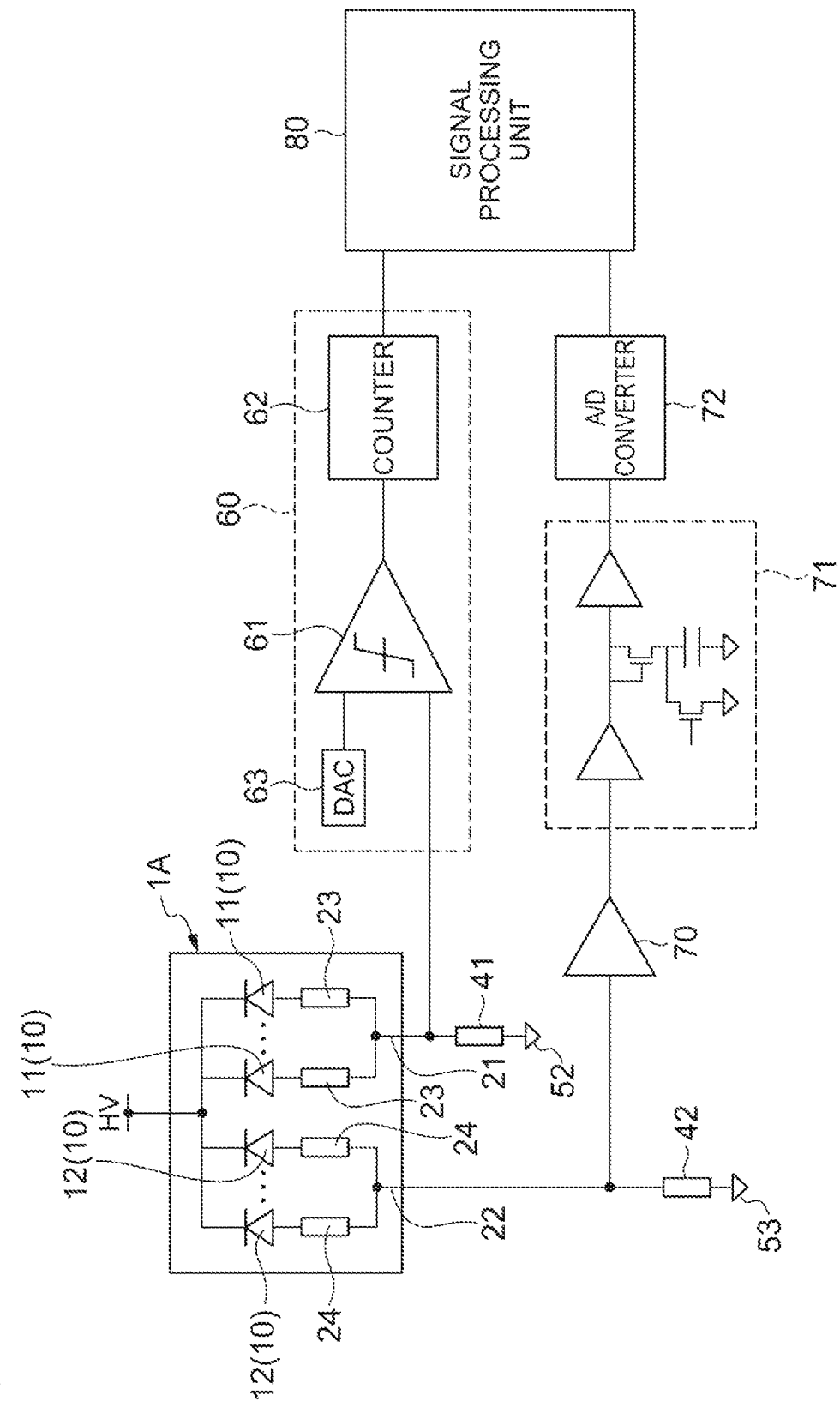
FIG. 9 is a diagram schematically illustrating a circuit configuration according to a third modified example.

FIG. 9 is a diagram illustrating a circuit configuration according to a third modified example according to an aspect of the invention. The common bias voltage HV is applied to the plurality of pixels 10 in the above-mentioned embodiment (see FIG. 4), but a bias voltage applied to the second pixels 12 is lower than a bias voltage applied to the first pixels 11 in this modified example. Specifically, a common bias voltage HV is applied to the cathodes of the APDs, and the anodes of the APDs of the first pixels 11 are connected to a first reference potential (GND) line 52 via the quenching resistor 23, the first line 21, and the resistor 41. On the other hand, the anodes of the APDs of the second pixels 12 are connected to a second reference potential (GND) line 53 via the quenching resistor 24, the second line 22, and the resistor 42. The potential of the second reference potential (GND) line 53 is set to be higher than the potential of the first reference potential (GND) line 52. Accordingly, the bias voltage applied to the second pixels 12 is substantially lower than the bias voltage applied to the first pixels 11.

According to this modified example, it is possible to increase sensitivity of the first pixels 11 to an incident light intensity and to output a larger current for a weak incident light intensity therefrom. In other words, since a current can be output with a larger gain for the incident light intensity, it is possible to decrease a lower limit of a detectable incident light intensity. On the other hand, it is possible to decrease sensitivity of the second pixels 12 to an incident light intensity and to further decrease an output current for a large incident light intensity. In other words, since a current can be output with a smaller gain for the incident light intensity, it is possible to increase an upper limit of an incident light intensity at which the output is saturated. Accordingly, according to this modified example, it is possible to widen a manageable light intensity range in comparison with the above-mentioned embodiment.

The cathodes of the APDs of the first pixels 11 may be electrically isolated from the cathodes of the APDs of the second pixels 12 and the bias voltage applied to the cathodes of the APDs of the first pixels 11 may be set to be higher than the bias voltage applied to the cathodes of the APDs of the second pixels 12. With this configuration, it is also possible to appropriately achieve the above-mentioned advantageous effects in this modified example.

In the above-mentioned embodiment, the resistance value of the resistor 41 that converts the output currents from the first pixels 11 into a voltage signal may be set to be greater than the resistance value of the resistor 42 that converts the output currents from the second pixels 12 into a voltage signal. Accordingly, even when an incident light intensity is weak, it is possible to convert the output currents from the first pixels 11 into a voltage signal with a relatively great amplification factor. In other words, since a voltage signal can be generated with a large gain for the incident light intensity, it is possible to accurately perform photon counting. On the other hand, even when an incident light intensity is relatively large, it is possible to convert the output currents from the second pixels 12 into a voltage signal with a relatively small amplification factor. In other words, since a voltage signal can be generated with a small gain for the incident light intensity, it is possible to increase an upper limit of the incident light intensity at which the output is saturated. Accordingly, it is possible to further widen a manageable light intensity range.

The photoelectric conversion element according to an aspect of the invention is not limited to the above-mentioned embodiment and can be modified in various forms. For example, the above-mentioned embodiment and the above-mentioned modified examples may be combined if necessary. In the above-mentioned embodiment, Si has been exemplified as the material of the semiconductor substrate 30 and the p-type semiconductor regions 32a and 32b, but various semiconductor materials can be employed for the semiconductor substrate and the p-type semiconductor regions in an aspect of the invention.

Second Embodiment

Hereinafter, another embodiment of the photoelectric conversion element according to an aspect of the invention will be described in detail with reference to the accompanying drawings. In description with reference to the drawings, the same elements will be referred to by the same reference signs and description thereof will not be repeated.

Figure 10:
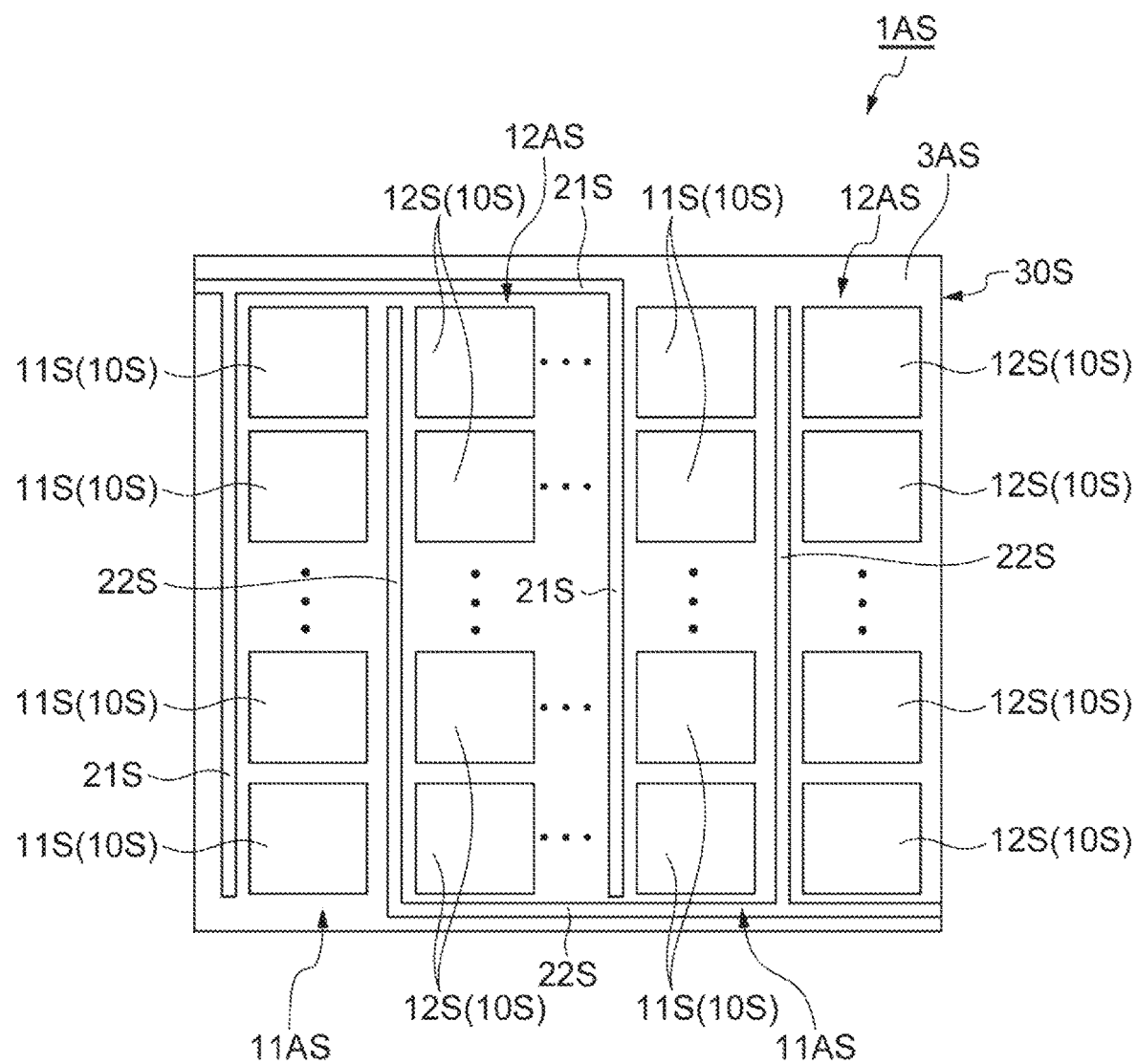
FIG. 10 is a plan view of a photoelectric conversion element according to an embodiment of an aspect of the invention.

FIG. 10 is a plan view of a photoelectric conversion element 1AS according to an embodiment of an aspect of the invention. The photoelectric conversion element 1AS includes a semiconductor substrate 30S, and a principal surface of the semiconductor substrate 30S serves as a light receiving portion 3AS that receives light. In the light receiving portion 3AS, a plurality of pixels 10S are arranged in a two-dimensional shape. Each of the plurality of pixels 10S includes an APD that operates with a common bias voltage.

The plurality of pixels 10S include two or more first pixels 11S and two or more second pixels 12S. A light receiving area (an effective sensitive area) of the first pixel 11S is substantially equal to the light receiving area of the second pixel 12S. For example, a pitch (an inter-center gap) between neighboring first pixels 11S is 50 μm, and a pitch between neighboring second pixels 12S is also 50 μm. In this embodiment, a first pixel array 11AS in which the first pixels 11S are arranged in a column direction and a second pixel array 12AS in which the second pixels 12S are arranged in the column direction are alternately arranged in a row direction.

The photoelectric conversion element 1AS further includes a first line 21S and a second line 22S for reading a signal. The first line 21S is electrically connected to two or more first pixels 11S and collectively extracts output currents from these first pixels 11S. The second line 22S is electrically connected to two or more second pixels 12S and collectively extracts output currents from these second pixels 12S.

Figure 11:
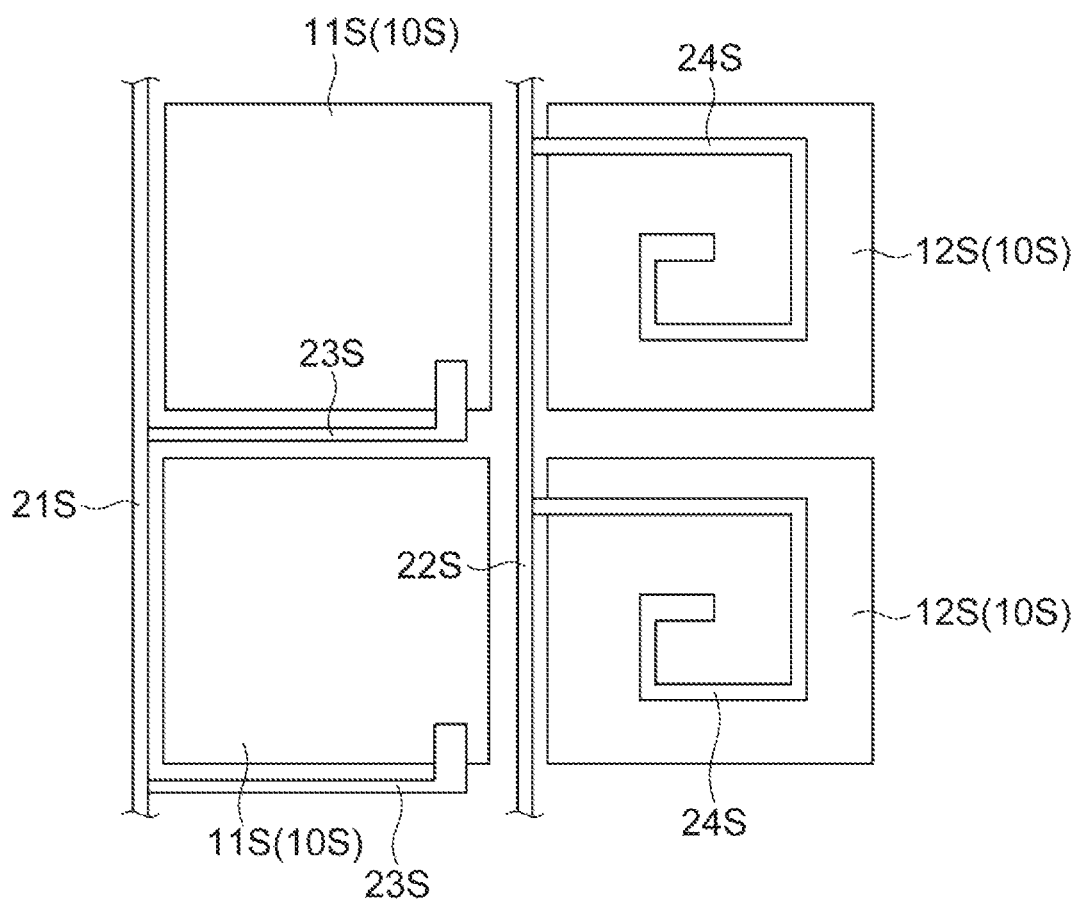
FIG. 11 is an enlarged plan view illustrating a part of a light receiving surface.

FIG. 11 is an enlarged plan view illustrating a part of the light receiving portion 3AS. As illustrated in FIG. 11, the APD of each first pixel 11S and the first line 21S are electrically connected to each other via a quenching resistor 23S. In other words, one end of the quenching resistor 23S is electrically connected to the APD of the corresponding first pixel 11S, and the other end thereof is electrically connected to the first line 21S. Similarly, the APD of each second pixel 12S and the second line 22S are electrically connected to each other via a quenching resistor 24S. In other words, one end of the quenching resistor 24S is electrically connected to the APD of the corresponding second pixel 12S, and the other end thereof is electrically connected to the second line 22S.

The resistance value of the quenching resistor 24S of the second pixel 12S is greater than the resistance value of the quenching resistor 23S of the first pixel 11S. For example, the resistance value of the quenching resistor 24S is 500 and the resistance value of the quenching resistor 23S is 250 kΩ. In another example, the resistance value of the quenching resistor 24S is 750 kΩ and the resistance value of the quenching resistor 23S is 250 kΩ. In another example, the resistance value of the quenching resistor 24S is 1 MΩ and the resistance value of the quenching resistor 23S is 250 kΩ. The resistance value of the quenching resistor 23S has only to be a non-latched (that is, quenchable) value.

This difference in resistance value between the quenching resistors is realized, for example, by setting cross-sectional areas of the quenching resistors to be different from each other or setting lengths of the quenching resistors to be different from each other. In the example illustrated in FIG. 11, the quenching resistor 23S is disposed in a straight line shape to have a small length in order to decrease the resistance value of the quenching resistor 23S, and the quenching resistor 24S is disposed in a spiral shape to increase the length in order to increase the resistance value of the quenching resistor 24S. The quenching resistors 23S and 24S are formed of, for example, a light-transmitting (translucent) conductive material.

Figure 12:
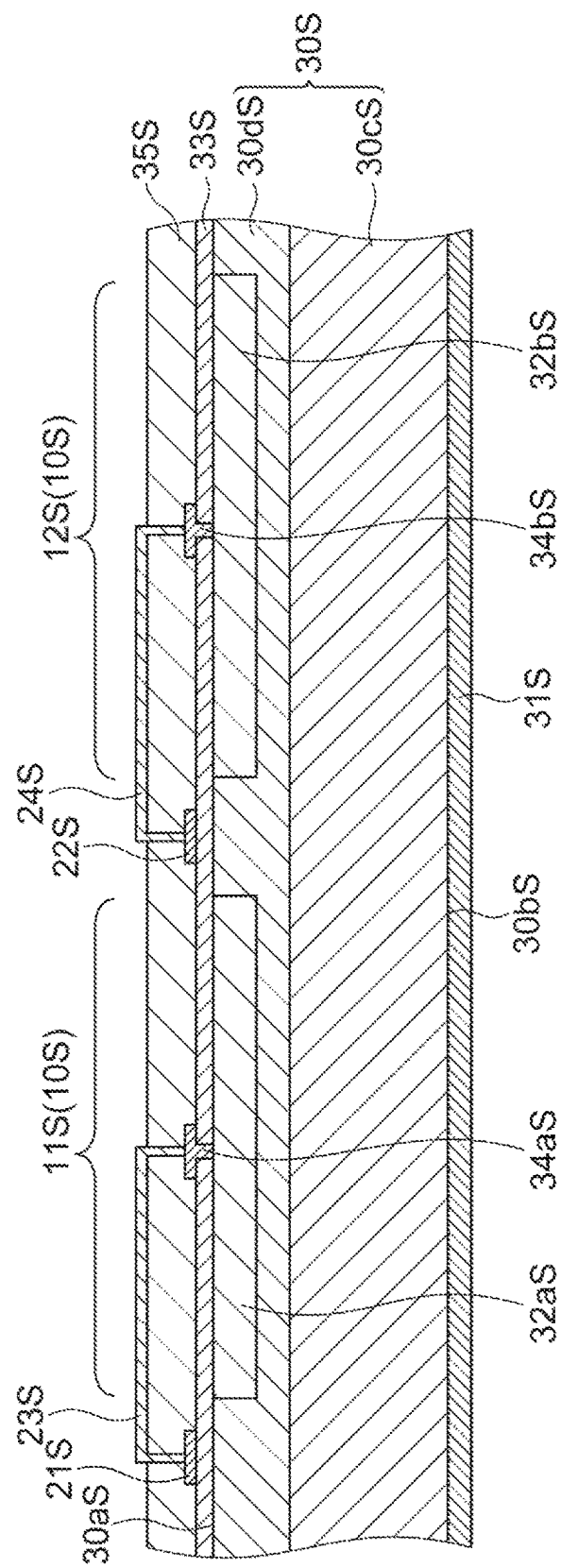
FIG. 12 is a diagram schematically illustrating a sectional configuration of the photoelectric conversion element.

FIG. 12 is a diagram schematically illustrating a sectional configuration of the photoelectric conversion element 1AS. The photoelectric conversion element 1AS includes a semiconductor substrate 30S. The plurality of pixels 10S are formed on the common semiconductor substrate 30S. Specifically, the semiconductor substrate 30S includes a principal surface 30aS and a rear surface 30bS, and a bottom electrode (a cathode) 31S is formed on the entire rear surface 30bS. In the semiconductor substrate 30S, a region 30cS including the rear surface 30bS and being formed of n-type Si and a region 30dS including the principal surface 30aS and being formed of p-type Si are stacked. In the region 30dS including the principal surface 30aS, a p-type semiconductor region 32aS constituting a first pixel 11S and a p-type semiconductor region 32bS constituting a second pixel 12S are arranged with a gap therebetween. The p-type semiconductor regions 32aS and 32bS are formed of, for example, p-type Si. The APD of the first pixel 11S is constituted by causing the region 30dS and the region 30cS just below the p-type semiconductor region 32aS to form a pn junction. Similarly, the APD of the second pixel 12S is constituted by causing the region 30dS and the region 30cS just below the p-type semiconductor region 32bS to form a pn junction.

A first insulating film 33S is formed on the entire surface of the principal surface 30aS. The first insulating film 33S can be formed of, for example, an insulating silicon compound such as $SiO_2$ or SiN. A contact electrode (an anode) 34aS is formed on the p-type semiconductor region 32aS and on the first insulating film 33S. The contact electrode 34aS is in contact with the p-type semiconductor region 32aS via an opening formed in the first insulating film 33S. Similarly, a contact electrode (an anode) 34bS is formed on the p-type semiconductor region 32bS and on the first insulating film 33S. The contact electrode 34bS is in contact with the p-type semiconductor region 32bS via an opening formed in the first insulating film 33S.

The first line 21S and the second line 22S are formed of a metal and are formed on the semiconductor substrate 30S. In this embodiment, the first line 21S and the second line 22S are formed on the first insulating film 33S which is located on the area of the semiconductor substrate 30S in which none of the p-type semiconductor region 32aS and the p-type semiconductor region 32bS is formed.

The first line 21S, the second line 22S, the first insulating film 33S, and the contact electrodes 34aS and 34bS are covered by a second insulating film 35S. The second insulating film 35S covers the entire surface of the semiconductor substrate 30S and can be formed of, for example, an inorganic insulator such as $SiO_2$ or SiN. The quenching resistors 23S and 24S are formed on the second insulating film 35S. One end and the other end of the quenching resistor 23S are electrically connected to the contact electrode 34aS and the first line 21S, respectively, via openings formed in the second insulating film 35S. One end and the other end of the quenching resistor 24S are electrically connected to the contact electrode 34bS and the second line 22S, respectively, via openings formed in the second insulating film 35S.

Figure 13:
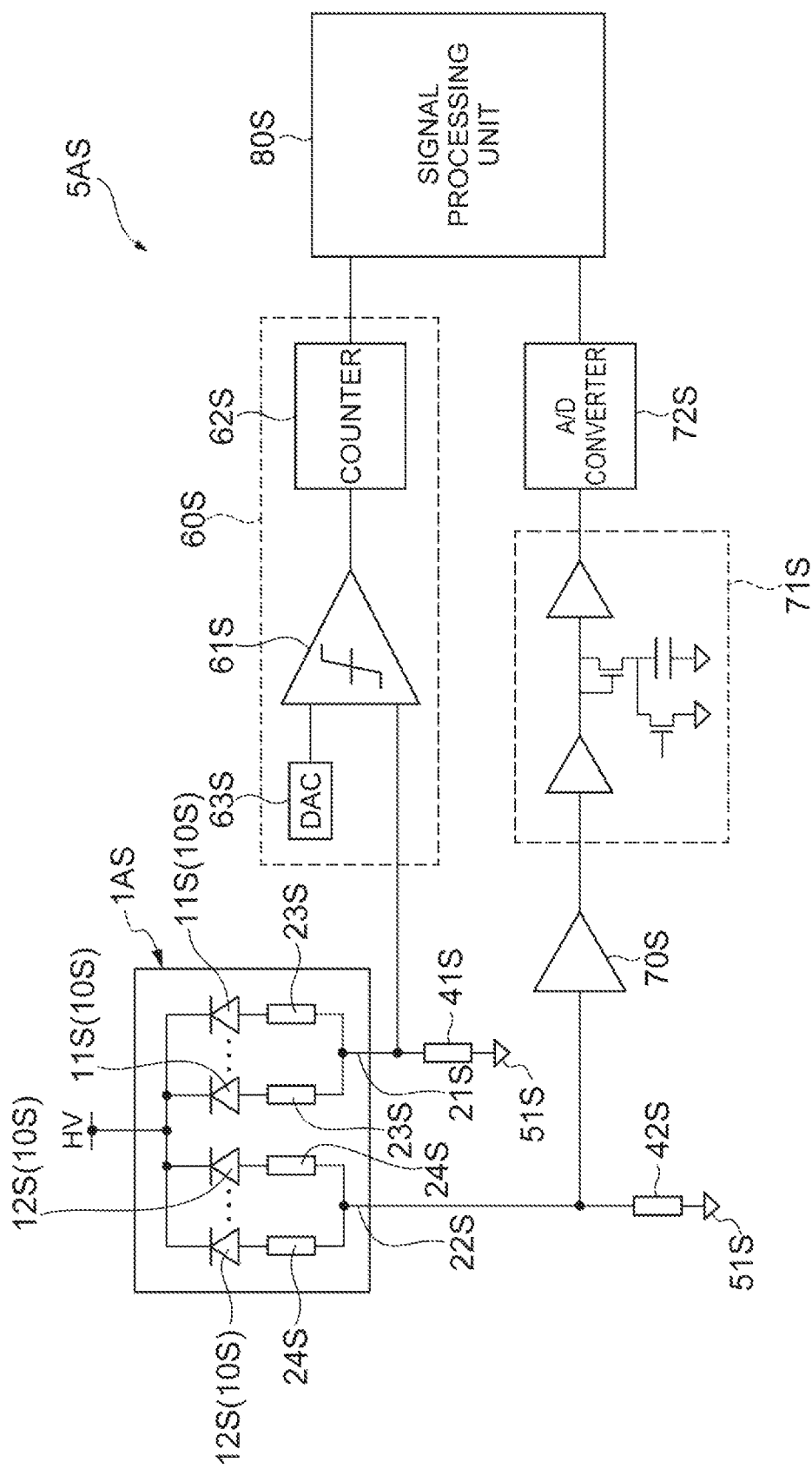
FIG. 13 is a diagram schematically illustrating an example of a configuration of an external circuit.

An example of a configuration of an external circuit that reads a signal from the photoelectric conversion element 1AS according to this embodiment will be described now. FIG. 13 is a diagram schematically illustrating an example of a configuration of an external circuit. As illustrated in FIG. 13, a common bias voltage HV is applied to the cathodes of the APDs of the plurality of pixels 10S, that is, the bottom electrodes 31S (see FIG. 12).

The anode of the APD of the first pixel 11S is connected to one end of a resistor 41S formed outside the photoelectric conversion element 1AS via the quenching resistor 23S and the first line 21S. The other end of the resistor 41S is connected to a reference potential (GND) line 51S. One end of the resistor 41S is connected to a photon counting circuit 60S, and a dropped voltage in the resistor 41S is input to the photon counting circuit 60S.

The photon counting circuit 60S includes a comparator 61S and a counter 62S. The comparator 61S compares a reference voltage generated by a D/A converter 63S with the dropped voltage in the resistor 41S. When the dropped voltage in the resistor 41S is higher than the reference voltage (that is, when a current pulse greater than a threshold value is output from the first pixel 11S), a signal is sent to the counter 62S. The counter 62S counts the number of times the signal has been sent from the comparator 61S. The count value corresponds to an incident light intensity on all the first pixels 11S.

The anode of the APD of the second pixel 12S is connected to one end of a resistor 42S disposed outside the photoelectric conversion element 1AS via the quenching resistor 24S and the second line 22S. The other end of the resistor 42S is connected to the reference potential (GND) line 51S. One end of the resistor 42S is connected to an A/D converter 72S via an amplifier circuit 70S and a peak hold circuit 71S. A dropped voltage in the resistor 42S is amplified by the amplifier circuit 70S and is then held by the peak hold circuit 71S. Then, the held voltage is input to the A/D converter 72S. The A/D converter 72S converts an input voltage signal (an analog signal) into a digital signal. The digital value corresponds to an incident light intensity on all the second pixels 12S.

The count value output from the counter 62S and the digital value output from the A/D converter 72S are sent to a signal processing unit 80S. The signal processing unit 80S selects one having a significant value of the count value and the digital value and specifies an incident light intensity on the basis of the selected value.

Advantageous effects obtained by the above-mentioned photoelectric conversion element 1AS according to this embodiment will be described below. In the photoelectric conversion element 1AS according to this embodiment, the resistance value of the quenching resistor 24S of the second pixel 12S is greater than the resistance value of the quenching resistor 23S of the first pixel 11S. In two or more first pixels 11S in which the resistance value of the quenching resistor 23S is relatively small, a relatively large current can be output even when an incident light intensity is weak. In other words, since a current can be output with a large gain for the incident light intensity, it is possible to decrease a lower limit of a detectable incident light intensity. On the other hand, in two or more second pixels 12S in which the resistance value of the quenching resistor 24S is relatively great, a relatively small current can be output even when an incident light intensity is relatively large. In other words, since a current can be output with a small gain for an incident light intensity, it is possible to increase an upper limit of the incident light intensity at which the output is saturated. Accordingly, with the photoelectric conversion element 1AS according to this embodiment, it is possible to cope with a wide light intensity range from a weak light intensity to a relatively large light intensity by selectively extracting the output current from the first line 21S or the second line 22S depending on the incident light intensity.

According to this embodiment, when an incident light intensity is weak and when an incident light intensity is relatively large, it is possible to cope with any case using one device with a common principle of light detection in the pixels. Accordingly, it is possible to expect use of a common operation voltage, a decrease in cost due to construction on the same substrate, and uniformity in characteristics. According to this embodiment, it is possible to arrange a plurality of pixels 10S in a two-dimensional shape and to easily realize a light receiving surface with a large area. It is possible to increase a degree of freedom in arrangement of a plurality of pixels 10S and to easily change the light receiving portion 3AS to a shape suitable for applications or optical systems such as a square, a rectangle, a circle, and a polygon.

As in this embodiment, the light receiving area of the first pixel 11S may be substantially equal to the light receiving area of the second pixel 12S. Accordingly, by only changing the resistance values of the quenching resistors 23S and 24S in the conventional photoelectric conversion element, it is possible to easily achieve the above-mentioned advantageous effects.

As in this embodiment, the quenching resistor 24S may be longer than the quenching resistor 23S. By employing this configuration, the resistance value of the quenching resistor 24S may be easily set to be greater than the resistance value of the quenching resistor 23S.

First Modified Example

Figure 14:
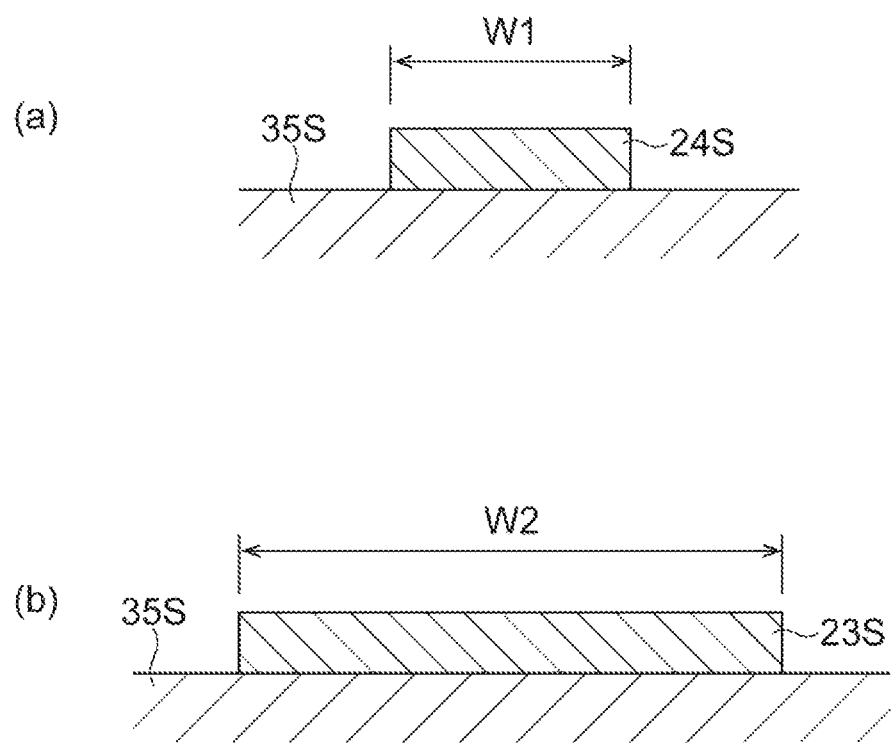
FIG. 14 is a diagram illustrating an example of a shape of a quenching resistor in a first modified example.

FIGS. 14(a) and 14(b) are sectional views of the quenching resistors 24S and 23S according to a modified example, and illustrate a sectional surface intersecting (typically being perpendicular to) the extending direction of the quenching resistors 24S and 23S. In this example, a width W1 of the quenching resistor 24S is less than a width W2 of the quenching resistor 23S. In the above-mentioned embodiment, the resistance values of the quenching resistors 23S and 24S are set to be different from each other by setting the lengths thereof to be different from each other, but the resistance values of the quenching resistors 23S and 24S can be set to be different from each other by setting the widths thereof to be different from each other as in this modified example.

Second Modified Example

Figure 15:
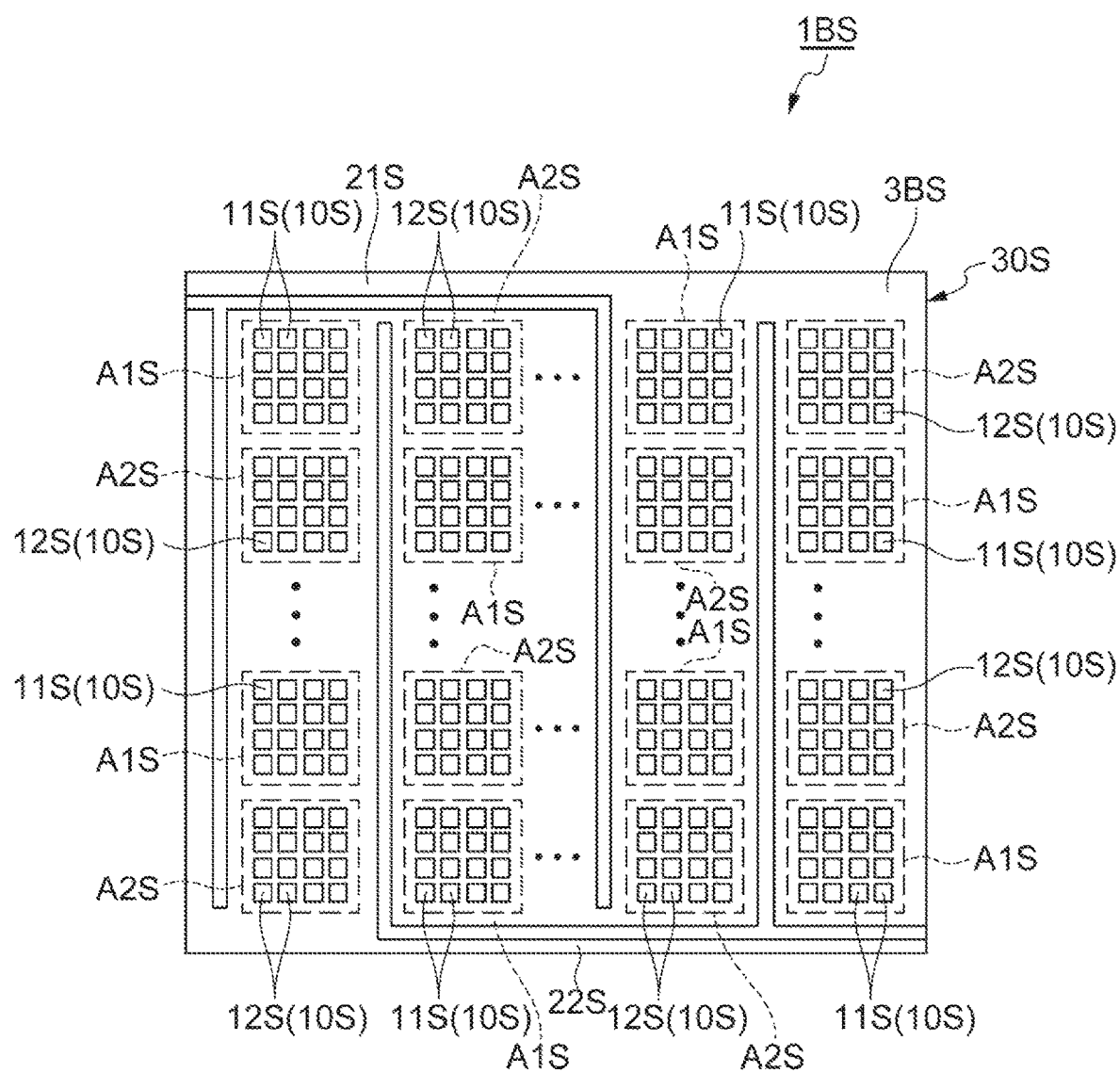
FIG. 15 is a plan view of a photoelectric conversion element according to a second modified example.

FIG. 15 is a plan view of a photoelectric conversion element 1BS according to a second modified example of an aspect of the invention. The photoelectric conversion element 1BS is different from that of the above-mentioned embodiment in the arrangement of the first pixels 11S and the second pixels 12S on the light receiving surface. In the light receiving portion 3BS according to this modified example, a plurality of first areas A1S including $K_1$ (where $K_1$ is an integer equal to or greater than 2; a case of $K_1=16$ is illustrated in the drawing) first pixels 11S and a plurality of second areas A2S including $K_2$ (where $K_2$ is an integer equal to or greater than 2; a case of $K_2=16$ is illustrated in the drawing) second pixels 12S are mixed and arranged in a two-dimensional shape (a matrix shape) in the light receiving portion 3BS. In the example illustrated in FIG. 15, the first areas A1S and the second areas A2S are arranged like a checkerboard pattern.

Figure 16:
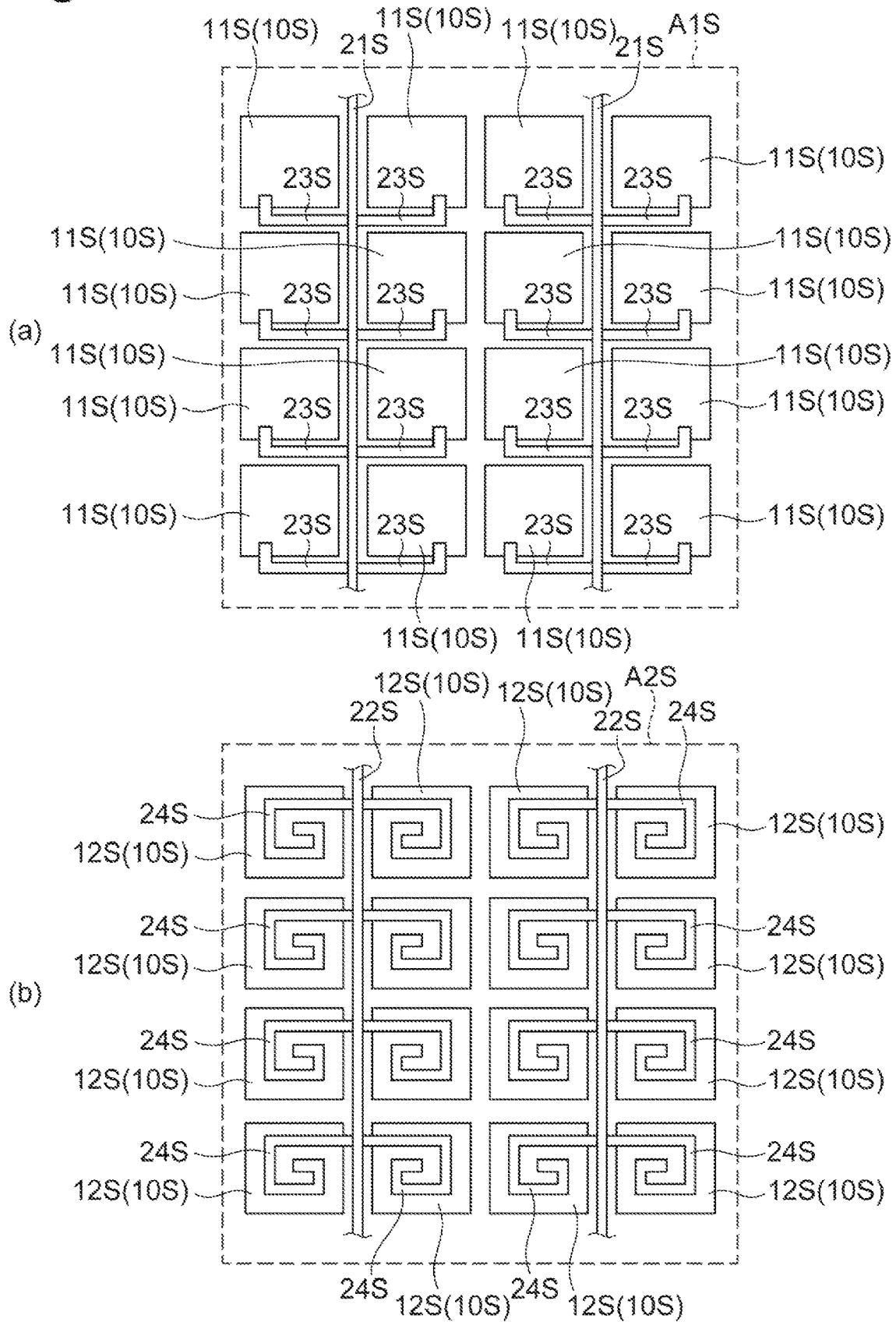
FIG. 16 is an enlarged plan view illustrating a part of a light receiving surface.
Figure 17:
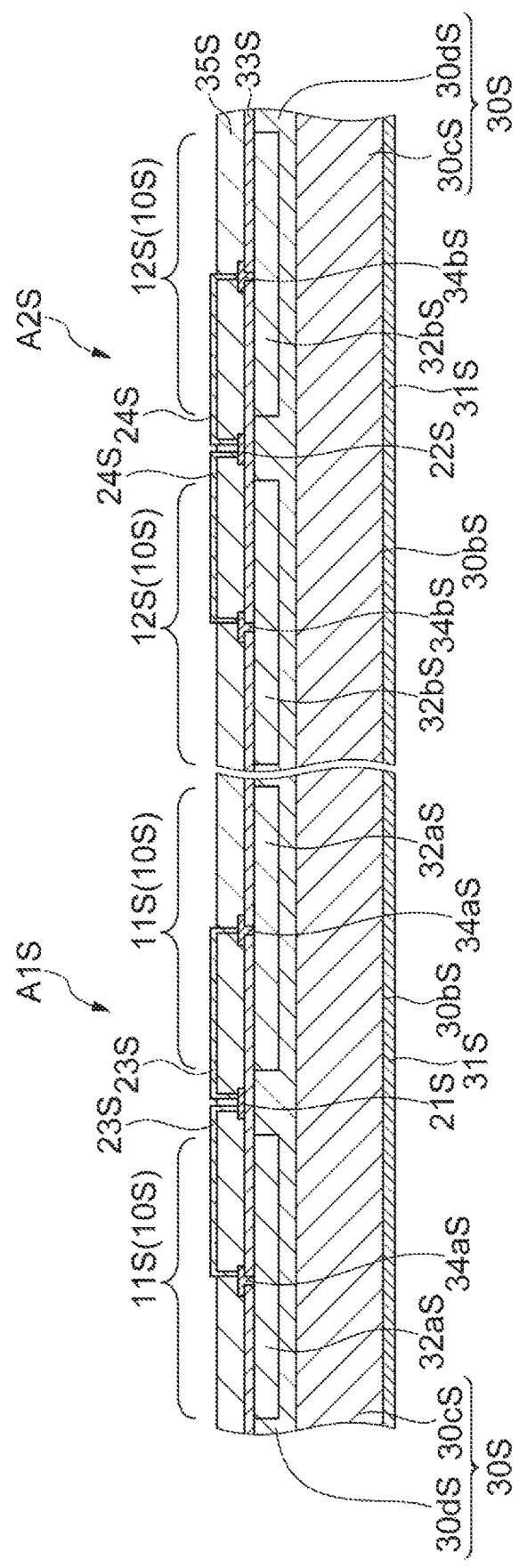
FIG. 17 is a diagram schematically illustrating a sectional configuration of the photoelectric conversion element.

FIGS. 16(a) and 16(b) are enlarged plan views illustrating the first area A1S and the second area A2S. FIG. 17 is a diagram schematically illustrating a sectional configuration of the photoelectric conversion element 1BS. In the example, the first pixels 11S are arranged in a two-dimensional shape of $M_1$ rows and $N_1$ columns (where $M_1$ and $N_1$ are integers equal to or greater than 1; $M_1 \times N_1 = K_1$) in the first area A1S. The first lines 21S are arranged every two columns, and the first pixels 11S located on both sides of each first line 21S are electrically connected to the first line 21S via the quenching resistors 23S. Similarly, the second pixels 12S are arranged in a two-dimensional shape of $M_2$ rows and $N_2$ columns (where $M_2$ and $N_2$ are integers equal to or greater than 1; $M_2 \times N_2 = K_2$) in the second area A2S. The second lines 22S are arranged every two columns, and the second pixels 12S located on both sides of each second line 22S are electrically connected to the second line 22S via the quenching resistors 24S.

The arrangement of the first and second pixels in an aspect of the invention is not limited to the above-mentioned embodiment, and, for example, various arrangements like the photoelectric conversion element 1BS according to this modified example can be employed. With any arrangement of pixels, it is possible to appropriately achieve the same advantageous effects as in the photoelectric conversion element 1AS according to the above-mentioned embodiment.

Third Modified Example

Figure 18:
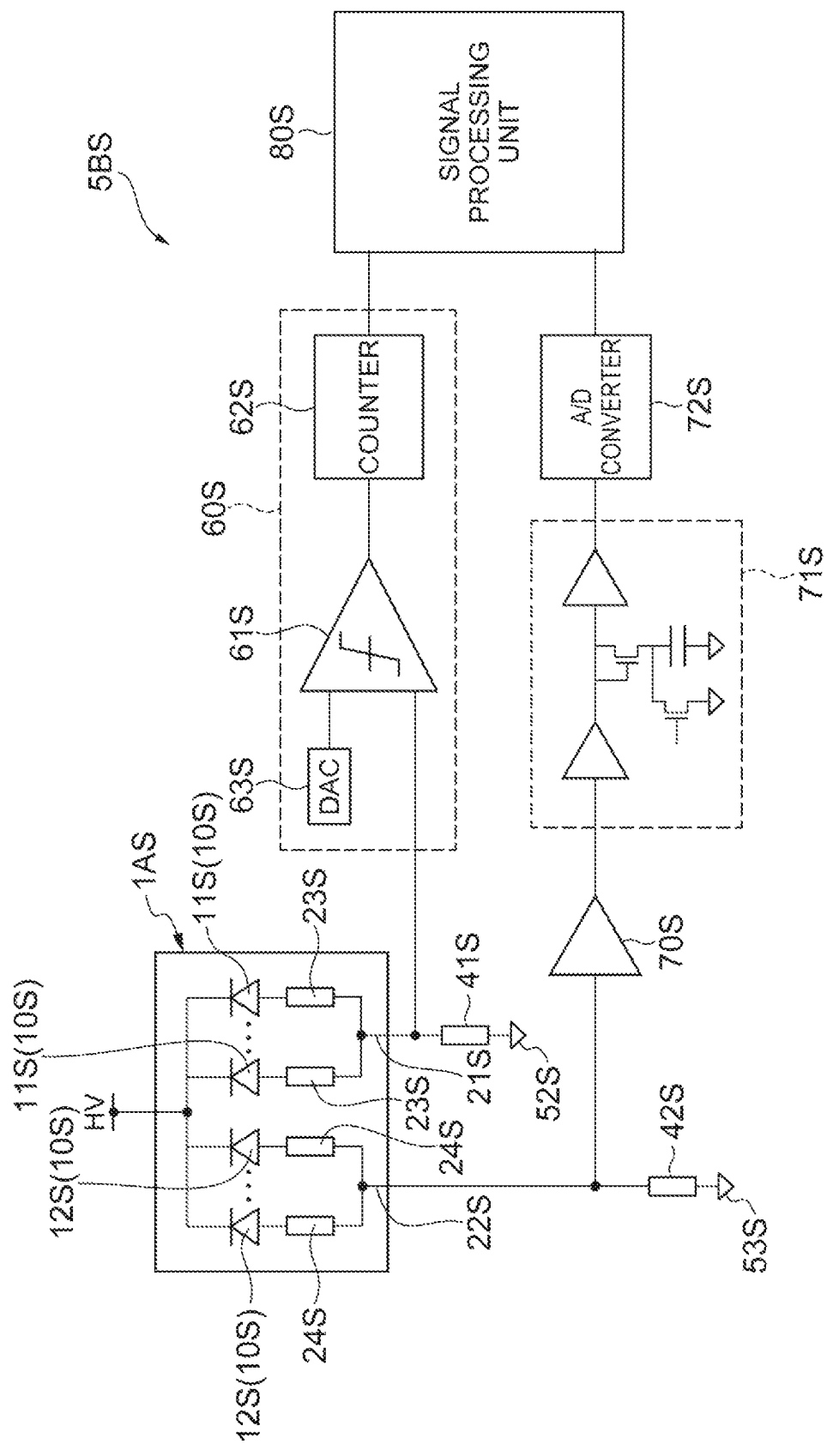
FIG. 18 is a diagram schematically illustrating a circuit configuration according to a third modified example.

FIG. 18 is a diagram illustrating a circuit configuration according to a third modified example according to an aspect of the invention. The common bias voltage HV is applied to the plurality of pixels 10S in the above-mentioned embodiment (see FIG. 13), but a bias voltage applied to the second pixels 12S is lower than a bias voltage applied to the first pixels 11S in this modified example. Specifically, a common bias voltage HV is applied to the cathodes of the APDs, and the anodes of the APDs of the first pixels 11S are connected to a first reference potential (GND) line 52S via the quenching resistor 23S, the first line 21S, and the resistor 41S. On the other hand, the anodes of the APDs of the second pixels 12S are connected to a second reference potential (GND) line 53S via the quenching resistor 24S, the second line 22S, and the resistor 42S. The potential of the second reference potential (GND) line 53S is set to be higher than the potential of the first reference potential (GND) line 52S. Accordingly, the bias voltage applied to the second pixels 12S is substantially lower than the bias voltage applied to the first pixels 11S.

According to this modified example, it is possible to increase sensitivity of the first pixels 11S to an incident light intensity and to output an even larger current for a weak incident light intensity therefrom. In other words, since a current can be output with a larger gain for the incident light intensity, it is possible to decrease a lower limit of a detectable incident light intensity. On the other hand, it is possible to decrease sensitivity of the second pixels 12S to an incident light intensity and to decrease an output current for a large incident light intensity. In other words, since a current can be output with a smaller gain for the incident light intensity, it is possible to increase an upper limit of an incident light intensity at which the output is saturated. Accordingly, according to this modified example, it is possible to widen a manageable light intensity range in comparison with the above-mentioned embodiment.

The cathodes of the APDs of the first pixels 11S may be electrically isolated from the cathodes of the APDs of the second pixels 12S and the bias voltage applied to the cathodes of the APDs of the first pixels 11S may be set to be higher than the bias voltage applied to the cathodes of the APDs of the second pixels 12S. With this configuration, it is also possible to appropriately achieve the above-mentioned advantageous effects in this modified example.

In the above-mentioned embodiment, the resistance value of the resistor 41S that converts the output currents from the first pixels 11S into a voltage signal may be set to be greater than the resistance value of the resistor 42S that converts the output currents from the second pixels 12S into a voltage signal. Accordingly, even when an incident light intensity is weak, it is possible to convert the output currents from the first pixels 11S into a voltage signal with a relatively great amplification factor. In other words, since a voltage signal can be generated with a large gain for the incident light intensity, it is possible to accurately perform photon counting. On the other hand, even when an incident light intensity is relatively large, it is possible to convert the output currents from the second pixels 12S into a voltage signal with a relatively small amplification factor. In other words, since a voltage signal can be generated with a small gain for the incident light intensity, it is possible to increase an upper limit of the incident light intensity at which the output is saturated. Accordingly, it is possible to further widen a manageable light intensity range.

The photoelectric conversion element according to an aspect of the invention is not limited to the above-mentioned embodiment and can be modified in various forms. For example, the above-mentioned embodiment and the above-mentioned modified examples may be combined if necessary. In the above-mentioned embodiment and the first modified example, the resistance values of the quenching resistors 23S and 24S are set to be different from each other by setting the lengths or the widths thereof to be different from each other, but the resistance values of the quenching resistors 23S and 24S may be set to be different from each other using another method. For example, the resistance values may be appropriately set to be different from each other by setting the concentrations of resistive components added to the quenching resistors 23S and 24S to be different from each other. In the above-mentioned embodiment, Si has been exemplified as the material of the semiconductor substrate 30S and the p-type semiconductor regions 32aS and 32bS, but various semiconductor materials can be employed for the semiconductor substrate and the p-type semiconductor regions in an aspect of the invention.

Third Embodiment

Hereinafter, another embodiment of the photoelectric conversion element and the photoelectric conversion module according to an aspect of the invention will be described in detail with reference to the accompanying drawings. In description with reference to the drawings, the same elements will be referred to by the same reference signs and description thereof will not be repeated.

Figure 19:
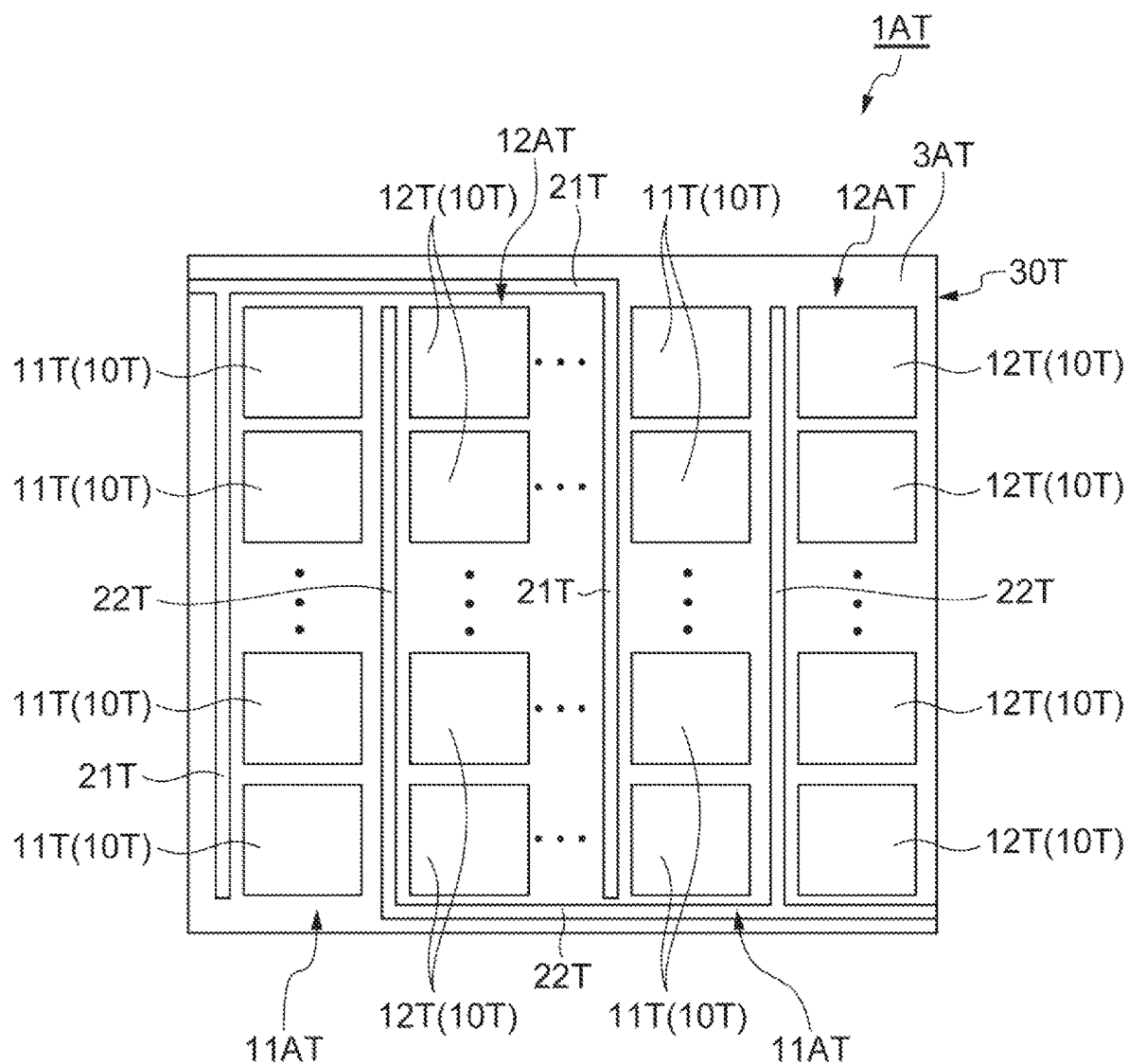
FIG. 19 is a plan view of a photoelectric conversion element according to an embodiment of an aspect of the invention.

FIG. 19 is a plan view of a photoelectric conversion element 1AT according to an embodiment of an aspect of the invention. The photoelectric conversion element 1AT includes a semiconductor substrate 30T, and a principal surface of the semiconductor substrate 30T serves as a light receiving portion 3AT that receives light. In the light receiving portion 3AT, a plurality of pixels 10T are arranged in a two-dimensional shape. Each of the plurality of pixels 10T includes an APD that operates with a common bias voltage.

The plurality of pixels 10T include two or more first pixels and two or more second pixels 12T. A light receiving area (an effective sensitive area) of the first pixel in is substantially equal to the light receiving area of the second pixel 12T. For example, a pitch (an inter-center gap) between neighboring first pixels 11T is 50 µm, and a pitch between neighboring second pixels 12T is also 50 µm. In this embodiment, a first pixel array 11AT in which the first pixels 11T are arranged in a column direction and a second pixel array 12AT in which the second pixels 12T are arranged in the column direction are alternately arranged in a row direction.

The photoelectric conversion element 1AT further includes a first line 21T and a second line 22T for reading a signal. The first line 21T is electrically connected to two or more first pixels 11T and collectively extracts output currents from these first pixels 11T. The second line 22T is electrically connected to two or more second pixels 12T and collectively extracts output currents from these second pixels 12T.

Figure 20:
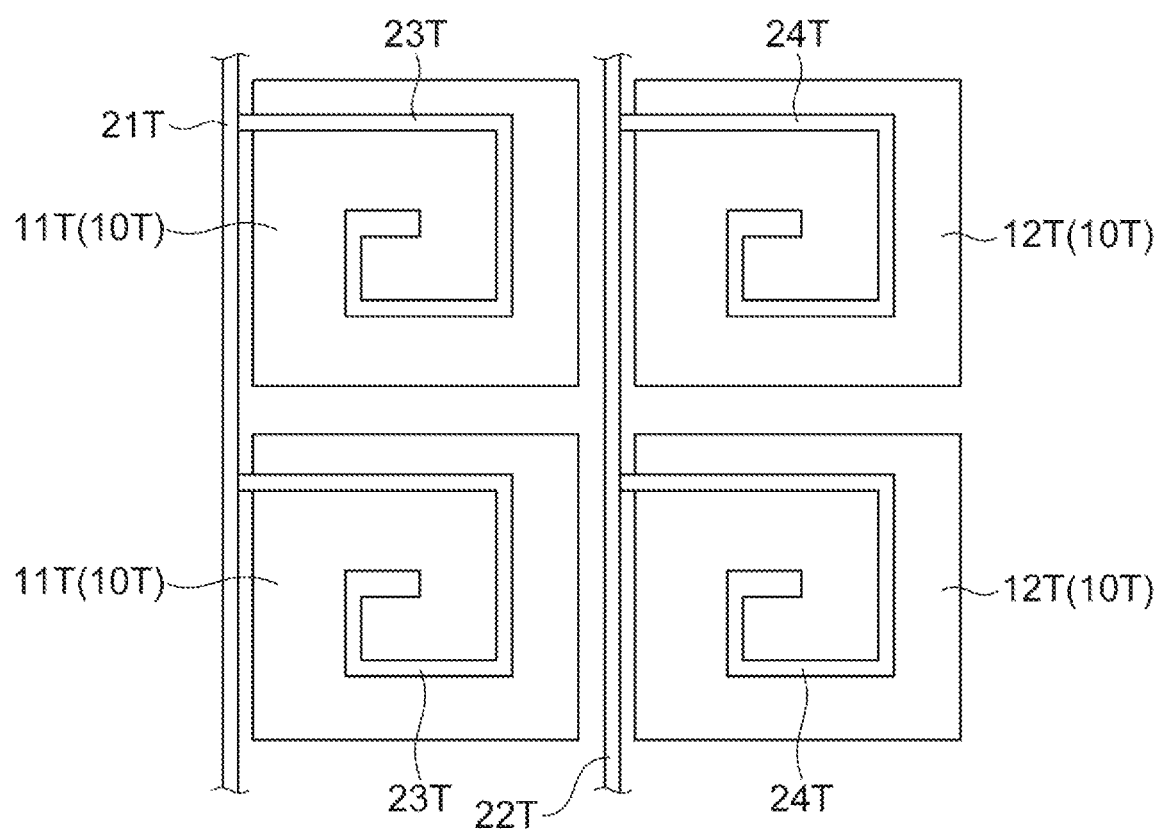
FIG. 20 is an enlarged plan view illustrating a part of a light receiving surface.

FIG. 20 is an enlarged plan view illustrating a part of the light receiving portion 3AT. As illustrated in FIG. 20, the APD of each first pixel 11T and the first line 21T are electrically connected to each other via a quenching resistor 23T. In other words, one end of the quenching resistor 23T is electrically connected to the APD of the corresponding first pixel 11T, and the other end thereof is electrically connected to the first line 21T. Similarly, the APD of each second pixel 12T and the second line 22T are electrically connected to each other via a quenching resistor 24T. In other words, one end of the quenching resistor 24T is electrically connected to the APD of the corresponding second pixel 12T, and the other end thereof is electrically connected to the second line 22T. The resistance values of the quenching resistors 23T and 24T are substantially equal to each other. For example, the resistance values of the quenching resistors 23T and 24T are 250 kΩ. In the example illustrated in the drawing, the quenching resistors 23T and 24T are arranged in a spiral shape, but the quenching resistors 23T and 24T may be arranged in various shapes and may be arranged, for example, in a straight line shape. The quenching resistors 23T and 24T are formed of, for example, a light-transmitting (translucent) conductive material.

Figure 21:
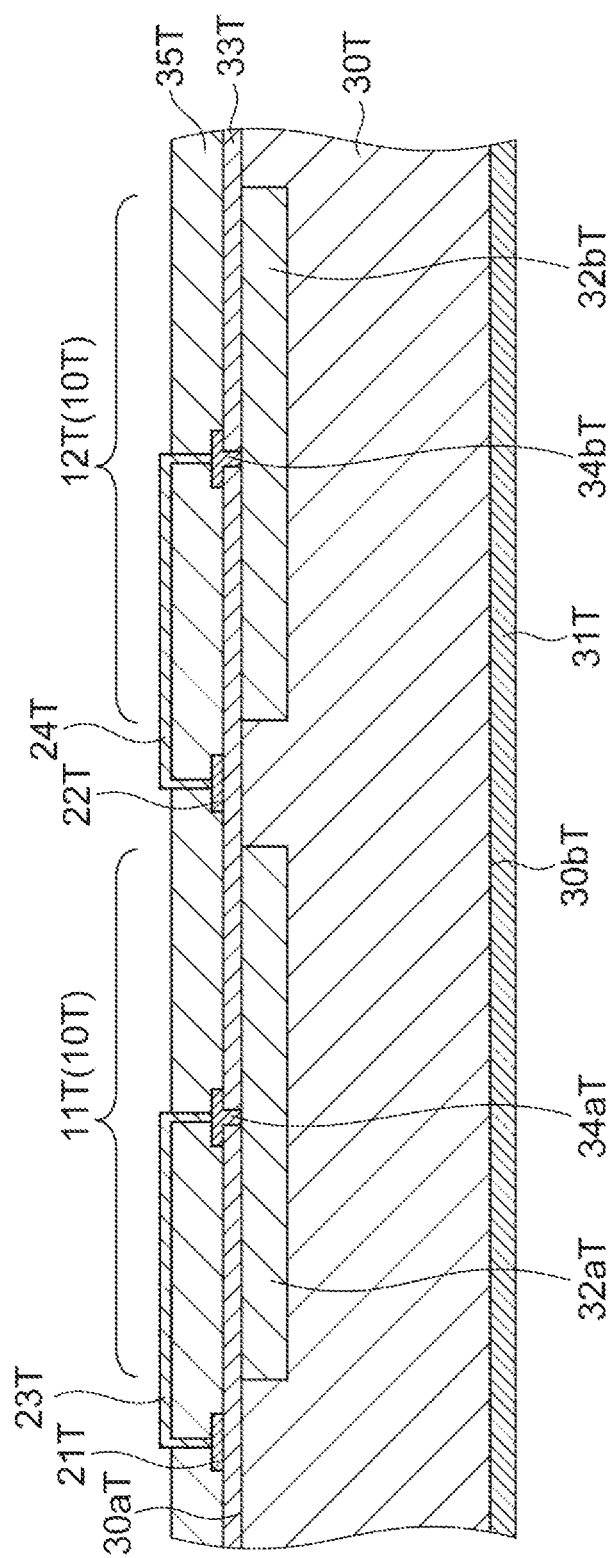
FIG. 21 is a diagram schematically illustrating a sectional configuration of the photoelectric conversion element.

FIG. 21 is a diagram schematically illustrating a sectional configuration of the photoelectric conversion element 1AT. The photoelectric conversion element 1AT includes a semiconductor substrate 30T formed of, for example, n-type Si. The plurality of pixels 10T are formed on the common semiconductor substrate 30T. Specifically, the semiconductor substrate 30T includes a principal surface 30aT and a rear surface 30bT, and a bottom electrode (a cathode) 31T is formed on the entire surface of the rear surface 30bT. In the semiconductor substrate 30T including the principal surface 30aT, a p-type semiconductor region 32aT constituting a first pixel 11T and a p-type semiconductor region 32bT constituting a second pixel 12T are arranged with a gap therebetween. The p-type semiconductor regions 32aT and 32bT are formed of, for example, p-type Si. The APD of the first pixel 11T is constituted by causing the p-type semiconductor region 32aT and the semiconductor substrate 30T to form a pn junction. Similarly, the APD of the second pixel 12T is constituted by causing the p-type semiconductor region 32bT and the semiconductor substrate 30T to form a pn junction.

A first insulating film 33T is formed on the entire surface of the principal surface 30aT. The first insulating film 33T can be formed of, for example, an insulating silicon compound such as $SiO_2$, or SiN. A contact electrode (an anode) 34aT is formed on the p-type semiconductor region 32aT and on the first insulating film 33T. The contact electrode 34aT is in contact with the p-type semiconductor region 32aT via an opening formed in the first insulating film 33T. Similarly, a contact electrode (an anode) 34bT is formed on the p-type semiconductor region 32bT and on the first insulating film 33T. The contact electrode 34bT is in contact with the p-type semiconductor region 32bT via an opening formed in the first insulating film 33T.

The first line 21T and the second line 22T are formed of a metal and are formed on the semiconductor substrate 30T. In this embodiment, the first line 21T and the second line 22T are formed on the first insulating film 33T which is located on the area of the semiconductor substrate 30T in which none of the p-type semiconductor region 32aT and the p-type semiconductor region 32bT is formed.

The first line 21T, the second line 22T, the first insulating film 33T, and the contact electrodes 34aT and 34bT are covered by a second insulating film 35T. The second insulating film 35T covers the entire surface of the semiconductor substrate 30T and can be formed of, for example, an inorganic insulator such as $SiO_2$ or SiN. The quenching resistors 23T and 24T are formed on the second insulating film 35T. One end and the other end of the quenching resistor 23T are electrically connected to the contact electrode 34aT and the first line 21T, respectively, via openings formed in the second insulating film 35T. One end and the other end of the quenching resistor 24T are electrically connected to the contact electrode 34bT and the second line 22T, respectively, via openings formed in the second insulating film 35T.

Figure 22:
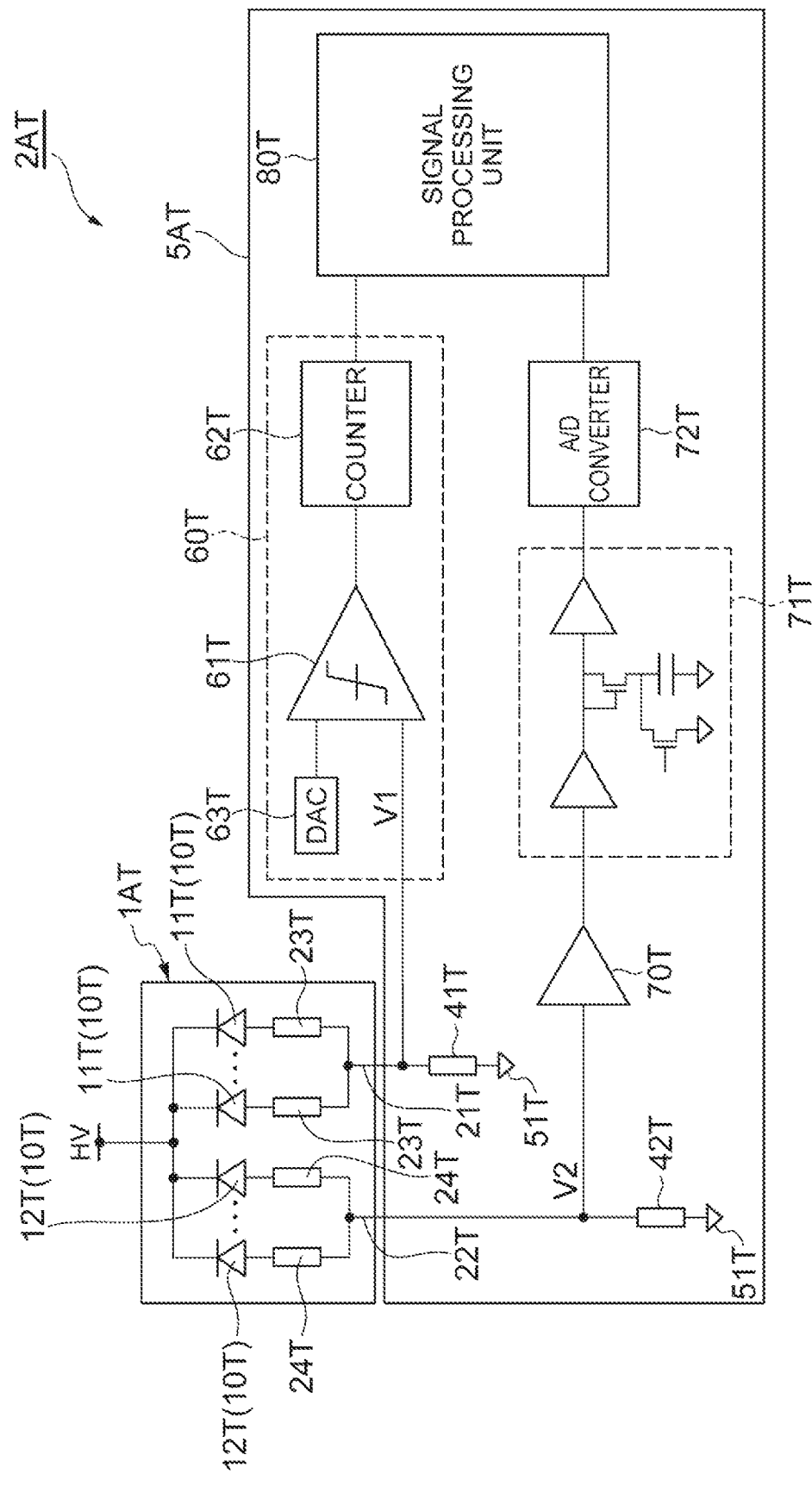
FIG. 22 is a diagram schematically illustrating an example of a configuration of an external circuit.

A configuration of a photoelectric conversion module including a photoelectric conversion element 1AT and a reader circuit that reads output currents from the photoelectric conversion element 1AT will be described below. FIG. 22 is a diagram schematically illustrating an example of a configuration of a photoelectric conversion module 2AT. As illustrated in FIG. 22, a common bias voltage HV is applied to the cathodes of the APDs of the plurality of pixels 10T, that is, the bottom electrode 31T (see FIG. 21).

A reader circuit 5AT includes a first resistor 41T, a second resistor 42T, a photon counting circuit 60T, an amplifier circuit 70T, a peak hold circuit 71T, an A/D converter 72T, and a signal processing unit 80T. The resistance value of the second resistor 42T is smaller than the resistance value of the first resistor 41T. For example, the resistance value of the first resistor 41T ranges from 1 MΩ to several MΩ, and the resistance value of the second resistor 42T is 50Ω (that is, normal 50Ω termination).

The first resistor 41T is connected between the first line 21T and a reference potential (GND) line 51T which is a fixed potential line, and converts output currents from the first pixels 11T into a first voltage signal V1. Specifically, one end of the resistor 41T is connected to the anodes of the APDs of the first pixels 11T via the first line 21T and the quenching resistors 23T. The other end of the resistor 41T is connected to the reference potential (GND) line 51T. One end of the resistor 41T is connected to the photon counting circuit 60T, and a dropped voltage in the resistor 41T is input as a first voltage signal V1 to the photon counting circuit 60T.

The photon counting circuit 60T includes a comparator 61T and a counter 62T. The comparator 61T compares a reference voltage generated by a D/A converter 63T with the first voltage signal V1. When the first voltage signal V1 is higher than the reference voltage (that is, when a current pulse greater than a threshold value is output from the first pixel 11T), a signal is sent to the counter 62T. The counter 62T counts the number of times the signal has been sent from the comparator 61T. The count value corresponds to an incident light intensity on all the first pixels 11T.

The second resistor 42T is connected between the second line 22T and the reference potential (GND) line 51T which is a fixed potential line, and converts output currents from the second pixels 12T into a second voltage signal V2. Specifically, one end of the resistor 42T is connected to the anodes of the APDs of the second pixels 12T via the second line 22T and the quenching resistors 24T. The other end of the resistor 42T is connected to the reference potential (GND) line 51T. One end of the resistor 42T is connected to the A/D converter 72T via the amplifier circuit 70T and the peak hold circuit 71T. The second voltage signal V2 is amplified by the amplifier circuit 70T and is then held by the peak hold circuit 71T. The held voltage is input to the A/D converter 72T. The A/D converter 72T converts the input voltage signal (an analog signal) into a digital signal. The digital value corresponds to an incident light intensity on all the second pixels 12T.

The count value output from the counter 62T and the digital value output from the A/D converter 72T are sent to the signal processing unit 80T. The signal processing unit 80T selects one having a significant value of the count value and the digital value and specifies an incident light intensity on the basis of the selected value.

Advantageous effects obtained by the above-mentioned photoelectric conversion module 2AT according to this embodiment will be described below. In the photoelectric conversion module 2AT, the resistance value of the resistor 41T that converts the output currents from the first pixels 11T into the first voltage signal V1 is greater than the resistance value of the resistor 42T that converts the output currents from the second pixels 12T into the second voltage signal V2. Accordingly, even when an incident light intensity is weak, it is possible to convert the output currents from two or more first pixels 11T into the first voltage signal V1 with a relatively large amplification factor. In other words, since the first voltage signal V1 can be generated with a large gain for the incident light intensity, it is possible to accurately perform photon counting. On the other hand, when an incident light intensity is relatively large, it is possible to convert the output currents from two or more second pixels 12T into the second voltage signal V2 with a relatively small amplification factor. In other words, since the second voltage signal V2 can be generated with a small gain for an incident light intensity, it is possible to increase an upper limit of the incident light intensity at which the output is saturated. Accordingly, with the photoelectric conversion module 2AT according to this embodiment, it is possible to cope with a wide light intensity range from a weak light intensity to a relatively large light intensity by selecting the count value based on the first voltage signal V1 or the digital value based on the second voltage signal V2 depending on the incident light intensity.

In this embodiment, the same configuration as the conventional photoelectric conversion element can be employed except that two types of lines (the first and second lines 21T and 22T) that collectively extract output currents from a plurality of pixels are provided. Accordingly, it is possible to very easily design the photoelectric conversion element 1AT and to curb a variation in characteristics from those of the conventional photoelectric conversion element.

According to this embodiment, when an incident light intensity is weak and when an incident light intensity is relatively large, it is possible to cope with any case using one device with a common principle of light detection in the pixels. Accordingly, it is possible to expect use of a common operation voltage, a decrease in cost due to construction on the same substrate, and uniformity in characteristics. According to this embodiment, it is possible to arrange a plurality of pixels 10T in a two-dimensional shape and to easily realize a light receiving surface with a large area. It is possible to increase a degree of freedom in arrangement of a plurality of pixels 10T and to easily change the light receiving portion 3AT to a shape suitable for applications or optical systems such as a square, a rectangle, a circle, and a polygon. In comparison with the configuration described in Patent Literature 1, shot noise is very small even when an incident light intensity is relatively large, and a high gain and a high S/N ratio can be made to be compatible in a wide light intensity range.

As in this embodiment, the reader circuit 5AT may include a photon counting circuit 60T that counts current pulses output from two or more first pixels 11T on the basis of the first voltage signal V1 and an A/D converter 72T that generates a digital signal corresponding to the second voltage signal V2. According to this configuration, it is possible to appropriately read a signal corresponding to a wide light intensity range from a weak light intensity to a relatively large light intensity.

First Modified Example

Figure 23:
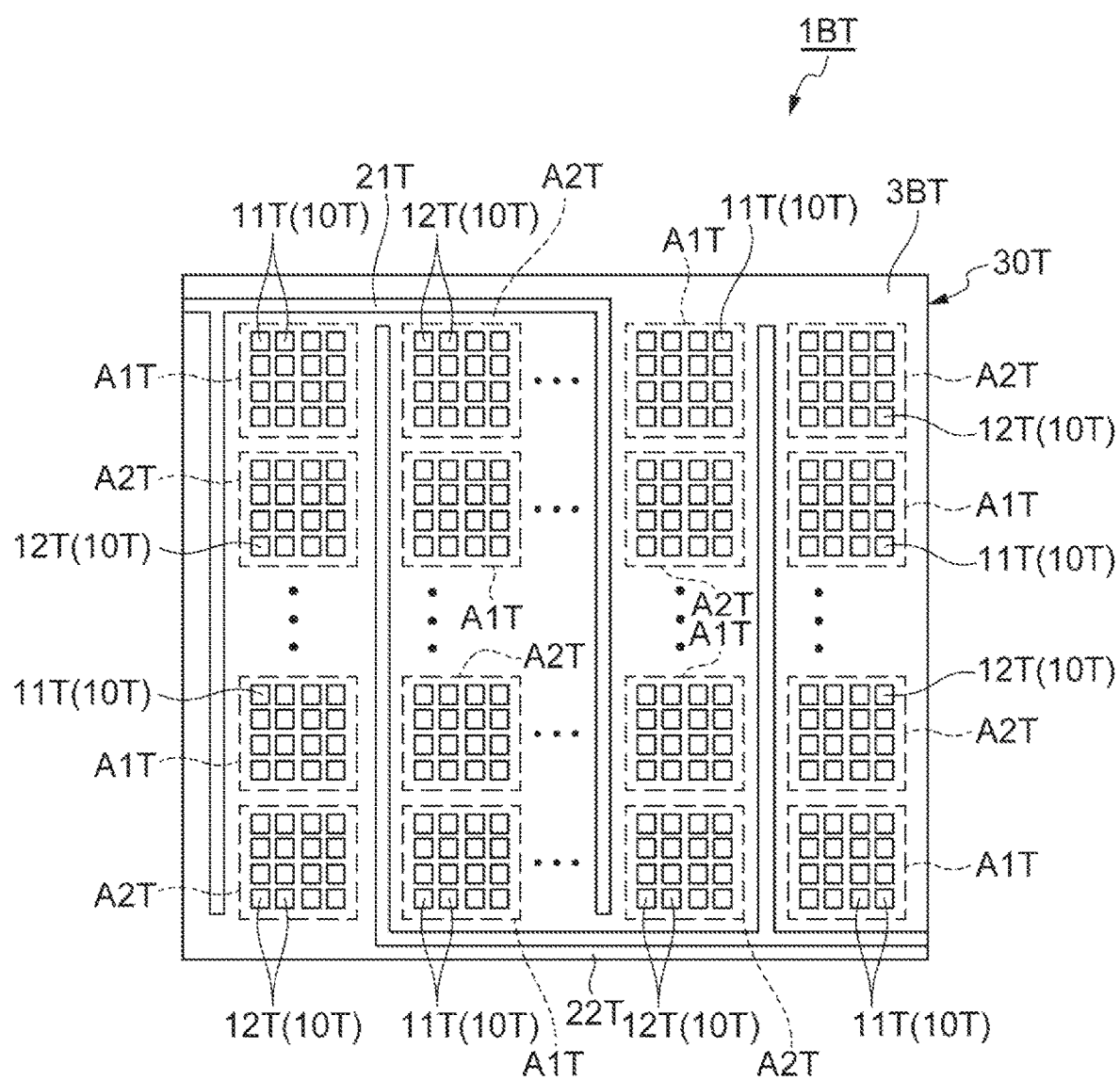
FIG. 23 is a plan view of a photoelectric conversion element according to a first modified example.

FIG. 23 is a plan view of a photoelectric conversion element 1BT according to a first modified example of an aspect of the invention. The photoelectric conversion element 1BT is different from that of the above-mentioned embodiment in the arrangement of the first pixels 11T and the second pixels 12T on the light receiving surface. In the light receiving portion 3BT according to this modified example, a plurality of first areas A1T including $K_1$ (where $K_1$ is an integer equal to or greater than 2; a case of $K_1$=16 is illustrated in the drawing) first pixels 11T and a plurality of second areas A2T including $K_2$ (where $K_2$ is an integer equal to or greater than 2; a case of $K_2$=16 is illustrated in the drawing) second pixels 12T are mixed and arranged in a two-dimensional shape (a matrix shape) in the light receiving portion 3BT. In the example illustrated in FIG. 23, the first areas A1T and the second areas A2T are arranged like a checkerboard pattern.

Figure 24:
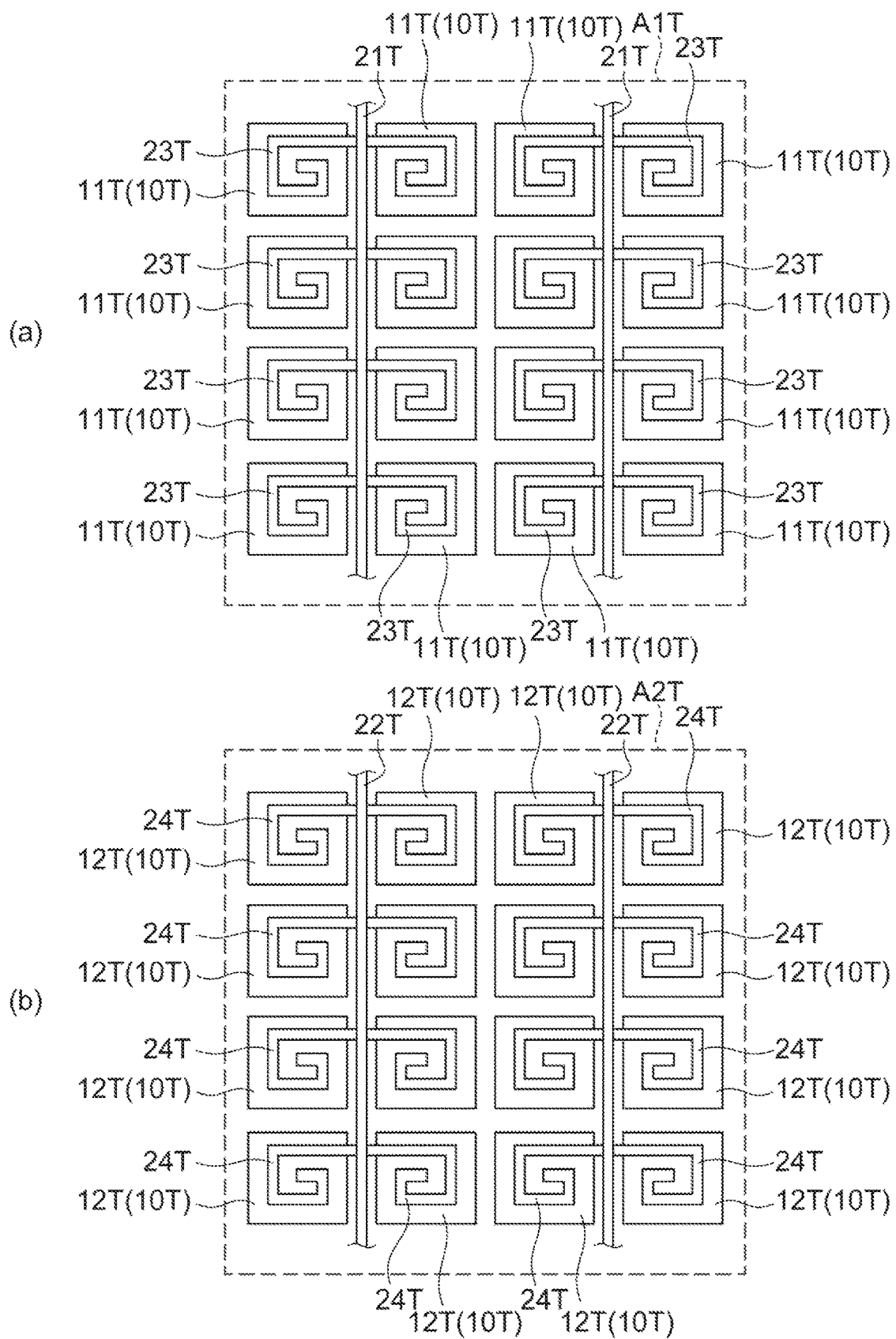
FIG. 24 is an enlarged plan view illustrating a part of a light receiving surface.
Figure 25:
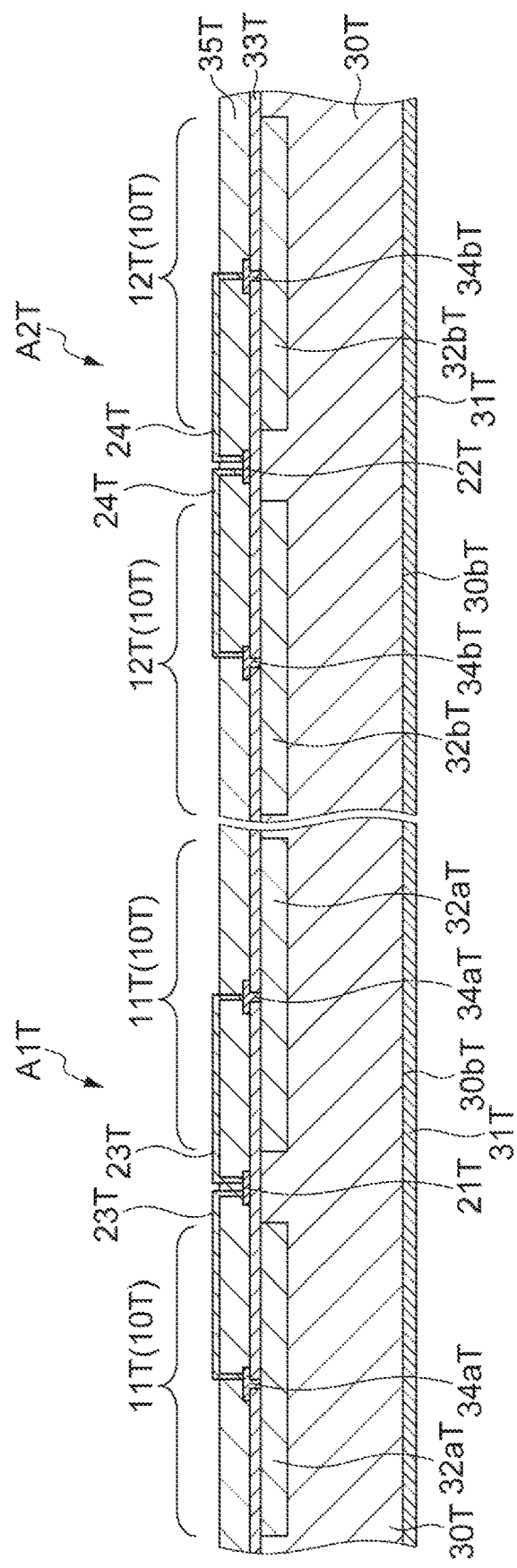
FIG. 25 is a diagram schematically illustrating a sectional configuration of the photoelectric conversion element.

FIGS. 24(a) and 24(b) are enlarged plan views illustrating the first area A1T and the second area A2T. FIG. 25 is a diagram schematically illustrating a sectional configuration of the photoelectric conversion element 1BT. In the example, the first pixels 11T are arranged in a two-dimensional shape of $M_1$ rows and $N_1$ columns (where $M_1$ and $N_1$ are integers equal to or greater than 1; $M_1 \times N_1 = K_1$) in the first area A1T. The first lines 21T are arranged every two columns, and the first pixels 11T located on both sides of each first line 21T are electrically connected to the first line 21T via the quenching resistors 23T. Similarly, the second pixels 12T are arranged in a two-dimensional shape of $M_2$ rows and $N_2$ columns (where $M_2$ and $N_2$ are integers equal to or greater than 1; $M_2 \times N_2 = K_2$) in the second area A2T. The second lines 22T are arranged every two columns, and the second pixels 12T located on both sides of each second line 22T are electrically connected to the second line 22T via the quenching resistors 24T.

The arrangement of the first and second pixels in an aspect of the invention is not limited to the above-mentioned embodiment, and, for example, various arrangements like the photoelectric conversion element 1BT according to this modified example can be employed. With any arrangement of pixels, it is possible to appropriately achieve the same advantageous effects as in the photoelectric conversion element 1AT and the photoelectric conversion module 2AT according to the above-mentioned embodiment.

Second Modified Example

Figure 26:
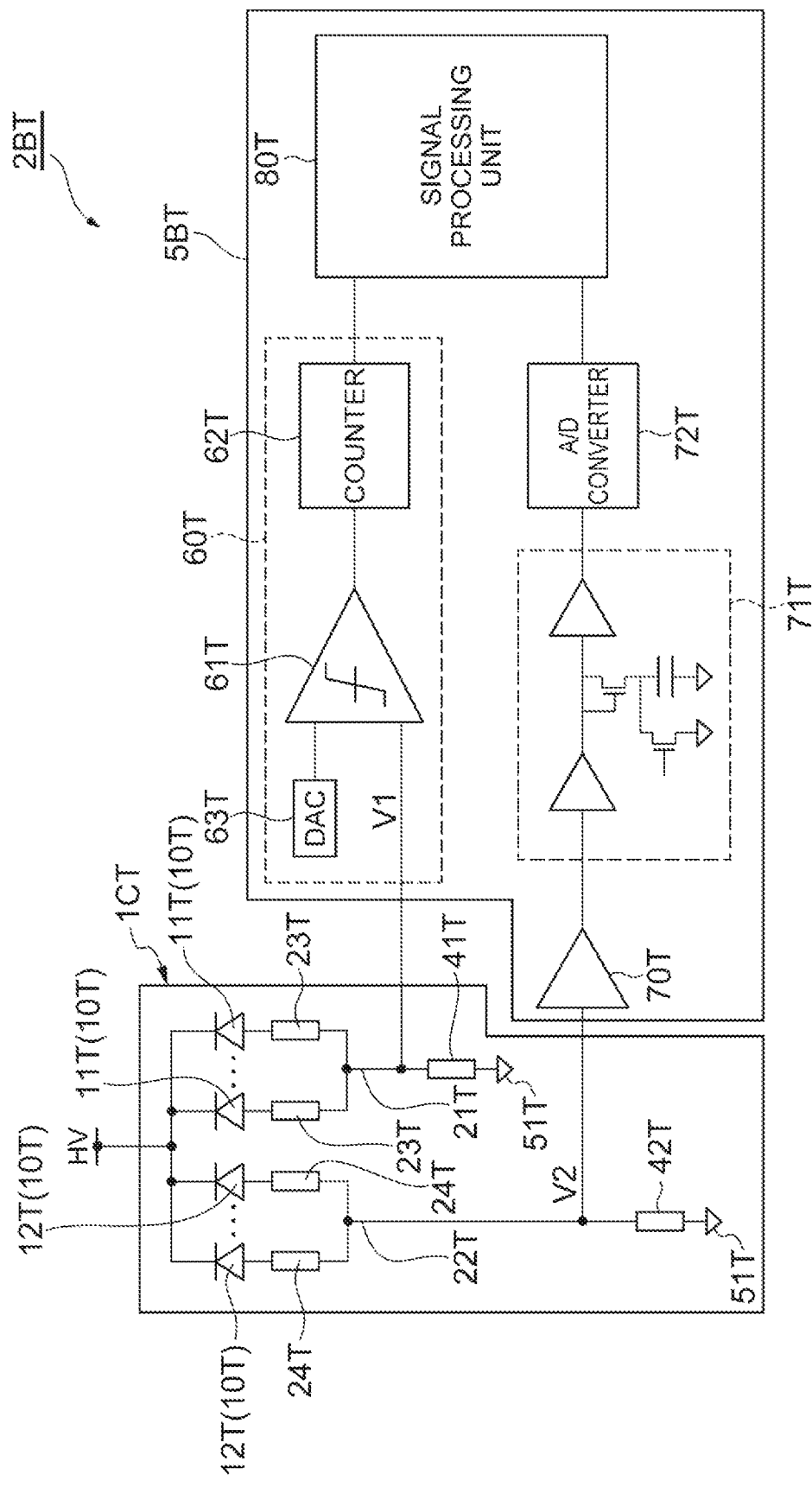
FIG. 26 is a diagram schematically illustrating an example of a configuration of an external circuit according to a second modified example.

FIG. 26 is a diagram illustrating a circuit configuration of a photoelectric conversion module 2BT according to a second modified example according to an aspect of the invention. The photoelectric conversion module 2BT is different from that of the above-mentioned embodiment in the arrangement of the resistors 41T and 42T. That is, the resistors 41T and 42T are included in the reader circuit 5AT in the above-mentioned embodiment, but in the photoelectric conversion module 2BT, the reader circuit 5BT does not include the resistors 41T and 42T and a photoelectric conversion element 1CT includes the resistors 41T and 42T. The configurations of the photoelectric conversion element 1CT and the reader circuit 5BT except for the arrangement of the resistors 41T and 42T are the same as the photoelectric conversion element 1AT and the reader circuit 5AT in the above-mentioned embodiment.

As in this modified example, the photoelectric conversion element 1CT may include the resistors 41T and 42T. In this case, it is possible to appropriately achieve the same advantageous effects as the photoelectric conversion module 2AT according to the above-mentioned embodiment.

The photoelectric conversion element and the photoelectric conversion module according to an aspect of the invention are not limited to the above-mentioned embodiments and can be modified in various forms. For example, the above-mentioned embodiments and the above-mentioned modified examples may be combined if necessary. In the above-mentioned embodiments, the resistance values of the resistors 41T and 42T are set to several MΩ and 50Ω, but the resistance values are not limited thereto and may be set to various resistance values. In the above-mentioned embodiments, Si has been exemplified as the material of the semiconductor substrate 30T and the p-type semiconductor regions 32aT and 32bT, but various semiconductor materials can be employed for the semiconductor substrate and the p-type semiconductor regions in an aspect of the invention.

INDUSTRIAL APPLICABILITY

It is possible to provide a photoelectric conversion element and a photoelectric conversion module that can cope with a wide light intensity range.

REFERENCE SIGNS LIST 1A to 1D Photoelectric conversion element
3A~3D Light receiving portion
10 Pixel
11 First pixel
11A First pixel array
12 Second pixel
12A Second pixel array
21 First line
22 Second line
23, 24 Quenching resistor
30 Semiconductor substrate
31 Bottom electrode
32a, 32b P-type semiconductor region
33 First insulating film
34a, 34b Contact electrode
35 Second insulating film
41, 42 Resistor
60 Photon counting circuit
61 Comparator
62 Counter
63 D/A converter
70 Amplifier circuit
71 Peak hold circuit
72 A/D converter
80 Signal processing unit
A1 First area
A2 Second area
A3 Third area
A4 Fourth area
1AS, 1BS Photoelectric conversion element
3AS, 3BS Light receiving portion
10S Pixel
11S First pixel
11AS First pixel array
12S Second pixel
12AS Second pixel array
21S First line
22S Second line
23S, 24S Quenching resistor
30S Semiconductor substrate
31S Bottom electrode
32aS, 32bS P-type semiconductor region
33S First insulating film
34aS, 34bS Contact electrode
35S Second insulating film
41S, 42S Resistor
60S Photon counting circuit
61S Comparator
62S Counter
63S D/A converter
70S Amplifier circuit
71S Peak hold circuit
72S A/D converter
80S Signal processing unit
A1S First area
A2S Second area
1AT~1CT Photoelectric conversion element
3AT, 3BT Light receiving portion
10T Pixel
11T First pixel
11AT First pixel array
12T Second pixel
12AT Second pixel array
21T First line
22T Second line
23T, 24T Quenching resistor
30T Semiconductor substrate
31T Bottom electrode
32aT, 32bT P-type semiconductor region
33T First insulating film
34aT, 34bT Contact electrode
35T Second insulating film
41T First resistor
42T Second resistor
60T Photon counting circuit
61T Comparator
62T Counter
63T D/A converter
70T Amplifier circuit
71T Peak hold circuit
72T A/D converter
80T Signal processing unit
A1T First area
A2T Second area

The invention claimed is:

1. A photoelectric conversion element comprising:
a plurality of pixels that are formed on a common semiconductor substrate and each of which includes an avalanche photodiode;
a first line that is formed on the semiconductor substrate, is electrically connected to two or more first pixels included in the plurality of pixels via a quenching resistor, and collectively extracts output currents from the two or more first pixels; and
a second line that is formed on the semiconductor substrate, is electrically connected to two or more second pixels included in the plurality of pixels via a quenching resistor, and collectively extracts output currents from the two or more second pixels,
wherein a light receiving area of each first pixel is larger than a light receiving area of each second pixel, and
wherein a resistance value of the quenching resistor of each second pixel is greater than a resistance value of the quenching resistor of each first pixel.

2. The photoelectric conversion element according to claim 1,
wherein the two or more second pixels are disposed in a first area, and
wherein the two or more first pixels are disposed in a second area which surrounds the first area.

3. The photoelectric conversion element according to claim 1,
wherein a plurality of third areas including $K_1$ (where $K_1$ is an integer equal to or greater than 2) second pixels and a plurality of fourth areas including L (where L is an integer equal to or greater than 1 and $L<K_1$ is satisfied) first pixels are mixed and arranged in a two-dimensional shape.

4. The photoelectric conversion element according to claim 1,
wherein a plurality of areas including one first pixel and $K_2$ (where $K_2$ is an integer equal to or greater than 1) second pixels are arranged in a two-dimensional shape.

5. The photoelectric conversion element according to claim 1,
wherein a bias voltage which is applied to the second pixels is less than a bias voltage which is applied to the first pixels.

6. A photoelectric conversion element comprising:
a plurality of pixels that are formed on a common semiconductor substrate and each of which includes an avalanche photodiode;
a first line that is formed on the semiconductor substrate, is electrically connected to two or more first pixels included in the plurality of pixels via a quenching resistor, and collectively extracts output currents from the two or more first pixels; and
a second line that is formed on the semiconductor substrate, is electrically connected to two or more second pixels included in the plurality of pixels via a quenching resistor, and collectively extracts output currents from the two or more second pixels,
wherein a resistance value of the quenching resistor of each second pixel is greater than a resistance value of the quenching resistor of each first pixel.

7. The photoelectric conversion element according to claim 6,
wherein a light receiving area of each first pixel and a light receiving area of each second pixel are substantially equal to each other.

8. The photoelectric conversion element according to claim 6,
wherein the quenching resistor of each second pixel is longer than the quenching resistor of each first pixel.

9. The photoelectric conversion element according to claim 6,
wherein a width in a direction intersecting an extending direction of the quenching resistor of each second pixel is smaller than a width in a direction intersecting an extending direction of the quenching resistor of each first pixel.

10. The photoelectric conversion element according to claim 6,
wherein a bias voltage which is applied to the second pixels is less than a bias voltage which is applied to the first pixels.

11. A photoelectric conversion element comprising:
a plurality of pixels that are formed on a common semiconductor substrate and each of which includes an avalanche photodiode that operates with a common bias voltage;
a first line that is formed on the semiconductor substrate, is electrically connected to two or more first pixels included in the plurality of pixels via a quenching resistor, and collectively extracts output currents from the two or more first pixels;
a second line that is formed on the semiconductor substrate, is electrically connected to two or more second pixels included in the plurality of pixels via a quenching resistor, and collectively extracts output currents from the two or more second pixels;
a first resistor that is connected between the first line and a fixed potential line and converts the output currents from the two or more first pixels into a first voltage signal; and
a second resistor that is connected between the second line and a fixed potential line and converts the output currents from the two or more second pixels into a second voltage signal,
wherein a resistance value of the second resistor is less than a resistance value of the first resistor, and
wherein a resistance value of the quenching resistor of each second pixel is greater than a resistance value of the quenching resistor of each first pixel.

12. A photoelectric conversion module comprising:
a photoelectric conversion element; and
a reader circuit that reads an output current from the photoelectric conversion element,
wherein the photoelectric conversion element includes
a plurality of pixels that are formed on a common semiconductor substrate and each of which includes an avalanche photodiode that operates with a common bias voltage,
a first line that is formed on the semiconductor substrate, is electrically connected to two or more first pixels included in the plurality of pixels via a quenching resistor, and collectively extracts output currents from the two or more first pixels, and
a second line that is formed on the semiconductor substrate, is electrically connected to two or more second pixels included in the plurality of pixels via a quenching resistor, and collectively extracts output currents from the two or more second pixels,
wherein the reader circuit or the photoelectric conversion element includes
a first resistor that is connected between the first line and a fixed potential line and converts the output currents from the two or more first pixels into a first voltage signal, and
a second resistor that is connected between the second line and a fixed potential line and converts the output currents from the two or more second pixels into a second voltage signal,
wherein a resistance value of the second resistor is less than a resistance value of the first resistor, and
wherein a resistance value of the quenching resistor of each second pixel is greater than a resistance value of the quenching resistor of each first pixel.

13. The photoelectric conversion module according to claim 12,
wherein the reader circuit includes:
a photon counting circuit that counts current pulses output from the two or more first pixels on the basis of the first voltage signal; and
an A/D converter that generates a digital signal corresponding to the second voltage signal.

14. A photoelectric conversion element comprising:
a plurality of pixels that are formed on a common semiconductor substrate and each of which includes an avalanche photodiode;
a first line that is formed on the semiconductor substrate, is electrically connected to two or more first pixels included in the plurality of pixels via a quenching resistor, and collectively extracts output currents from the two or more first pixels; and
a second line that is formed on the semiconductor substrate, is electrically connected to two or more second pixels included in the plurality of pixels via a quenching resistor, and collectively extracts output currents from the two or more second pixels,
wherein a light receiving area of each first pixel is larger than a light receiving area of each second pixel, and
wherein a bias voltage which is applied to the second pixels is less than a bias voltage which is applied to the first pixels.

15. The photoelectric conversion element according to claim 14,
 wherein the two or more second pixels are disposed in a first area, and
 wherein the two or more first pixels are disposed in a second area which surrounds the first area.

16. The photoelectric conversion element according to claim 14,
 wherein a plurality of third areas including $K_1$ (where $K_1$ is an integer equal to or greater than 2) second pixels and a plurality of fourth areas including L (where L is an integer equal to or greater than 1 and $L<K_1$ is satisfied) first pixels are mixed and arranged in a two-dimensional shape.

17. The photoelectric conversion element according to claim 14,
 wherein a plurality of areas including one first pixel and $K_2$ (where $K_2$ is an integer equal to or greater than 1) second pixels are arranged in a two-dimensional shape.

* * * * *

UNITED STATES PATENT AND TRADEMARK OFFICE
CERTIFICATE OF CORRECTION

PATENT NO. : 11,289,614 B2
APPLICATION NO. : 16/064165
DATED : March 29, 2022
INVENTOR(S) : Koei Yamamoto et al.

It is certified that error appears in the above-identified patent and that said Letters Patent is hereby corrected as shown below:

On the Title Page

In Item (87) "PCT Pub. Date:", change "Jun. 29, 2019" to --Jun. 29, 2017--

Signed and Sealed this
Seventh Day of June, 2022

Katherine Kelly Vidal
*Director of the United States Patent and Trademark Office*